United States Patent [19]

Miyamoto et al.

[11] Patent Number: 5,296,755
[45] Date of Patent: Mar. 22, 1994

[54] HIGH SPEED BI CMOS LOGIC CIRCUIT AND A SEMICONDUCTOR INTEGRATED CIRCUIT DEVICE USING SAME

[75] Inventors: Kazuhisa Miyamoto; Mitsugu Kusunoki, both of Ohme; Masanori Odaka, Kodaira; Mitsuo Usami, Akishima, all of Japan

[73] Assignee: Hitachi, Ltd., Tokyo, Japan

[21] Appl. No.: 799,327

[22] Filed: Nov. 27, 1991

[30] Foreign Application Priority Data

Nov. 29, 1990 [JP] Japan .................................. 2-332348

[51] Int. Cl.$^5$ .......................................... H03K 17/04
[52] U.S. Cl. ..................................... 307/446; 307/443; 307/570; 365/189.01
[58] Field of Search ............... 307/443, 446, 454–455, 307/465–466, 570; 365/189.01, 189.06

[56] References Cited

U.S. PATENT DOCUMENTS

| | | | |
|---|---|---|---|
| 4,682,202 | 7/1987 | Tanizawa | 307/465 X |
| 4,683,384 | 7/1987 | Shibata et al. | 307/465 X |
| 4,977,338 | 12/1990 | Miyaoka et al. | 307/446 |
| 4,999,518 | 3/1991 | Dheng et al. | 307/446 |
| 4,999,519 | 3/1991 | Kitsukawa et al. | 307/446 |
| 5,003,199 | 3/1991 | Chuang et al. | 307/446 |
| 5,006,732 | 4/1991 | Nakamura | 307/446 X |
| 5,023,479 | 6/1991 | Jeffery et al. | 307/446 |
| 5,045,726 | 9/1991 | Leung | 365/189.01 X |
| 5,132,566 | 7/1992 | Denda | 307/446 |

Primary Examiner—David R. Hudspeth
Attorney, Agent, or Firm—Antonelli, Terry, Stout & Kraus

[57] ABSTRACT

Herein disclosed is a logic circuit which has an input bipolar transistor for receiving an input signal at its base; variable impedance circuit having at least a first P-channel MOSFET connected between a first supply voltage and the collector of the input bipolar transistor; a second N-channel MOSFET connected between the emitter of the input bipolar transistor and a second supply voltage; an output bipolar transistor connected between the first supply voltage and the output terminal of the circuit for receiving the collector potential of the input bipolar transistor at its base; and a third, pull-down MOSFET connected between the output terminal and the second or third supply voltage.

55 Claims, 22 Drawing Sheets

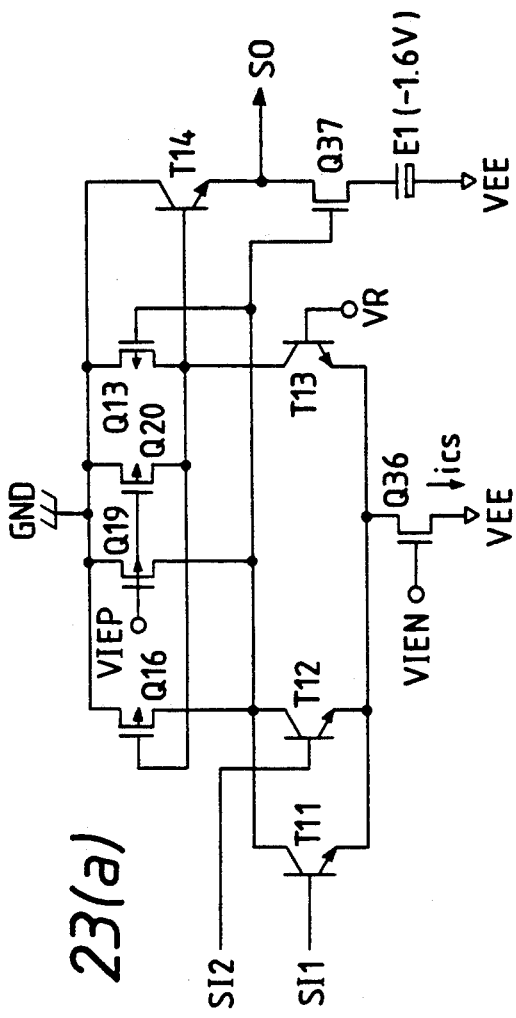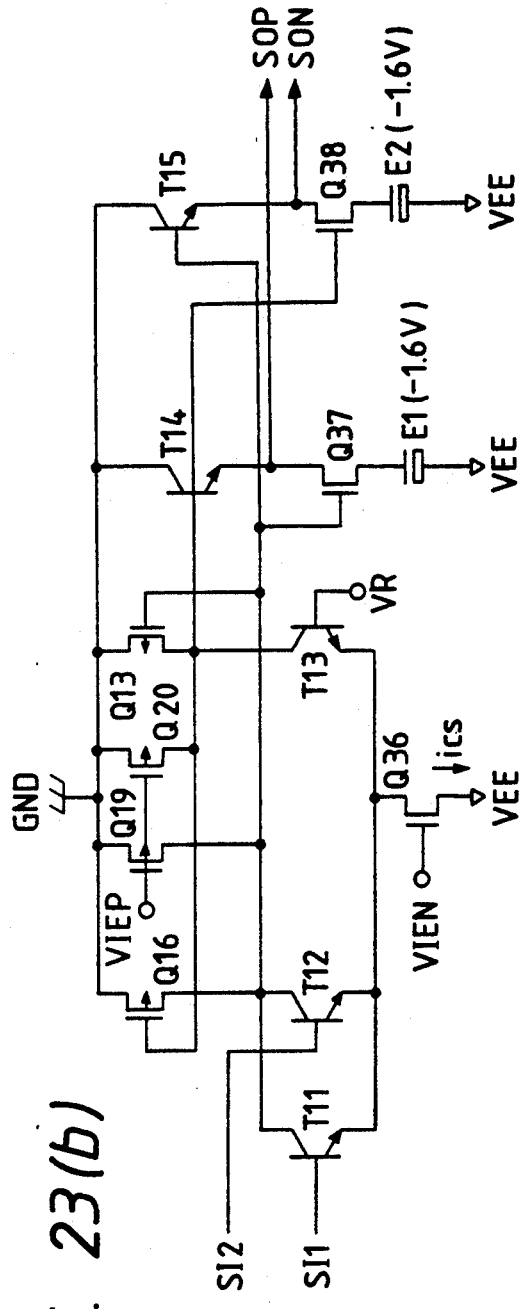
FIG. 23(a)
FIG. 23(b)

HIGH SPEED BI CMOS LOGIC CIRCUIT AND A SEMICONDUCTOR INTEGRATED CIRCUIT DEVICE USING SAME

BACKGROUND OF THE INVENTION

The present invention relates to a logic circuit and, more particularly, to a technology which is especially effective if used in a bipolar CMOS (which will be shortly referred to as the "Bi-CMOS") to be packaged in a high speed logic integrated circuit device or the like constituting a high speed computer.

There is a Bi-CMOS logic circuit which is composed of a pair of output bipolar transistors (as will be shortly referred to as the "transistors") in the shape of a totem pole and a CMOS (i.e., Complementary MOS) circuit for imparting a predetermined logic condition to those output transistors. There is also an ECL (i.e., Emitter Coupled Logic) circuit which is constructed of: a current switch circuit composed basically of differential transistors; and an emitter-follower circuit for transmitting the non-inverted and inverted output signal of the current switch circuit. There is further a high speed logic integrated circuit device which is constructed basically of the Bi-CMOS logic circuit or the ECL circuit, which may be combined to provide a high speed computer.

The Bi-CMOS logic circuit is disclosed, for example, in Japanese Patent Laid-Open No. 11034/1984 (corresponding to U.S. Pat. No. 4,890,017). On the other hand, the ECL circuit is disclosed, for example, in FIG. 1, on pp. 1301 to 1306 of "A 23-ps/2.1-mW ECL Gate with an AC-Coupled Active Pull-Down Emitter-Follower Stage" by K. Y. Toh et al. of VOL. 24, No. 5 of IEEE JOURNAL OF SOLID-STATE CIRCUITS issued in October, 1989.

The aforementioned high speed logic integrated circuit device or the like has its scale enlarged so that the circuit components of the logic circuit have a tendency to be further miniaturized and highly integrated. As a result, a problem arises in the degradation of reliability by hot carriers, and the absolute value of the supply voltage has to be reduced. However, this reduction of the absolute value of the supply voltage cannot be effected at will in the Bi-CMOS logic circuit of the prior art partly because the propagation delay time is longer than that of the ordinary CMOS logic circuit and partly because the amplitude of an output signal is compressed to an extent of the base-emitter voltage of the output transistors. In the ECL circuit of the prior art, moreover, the differential transistors are saturated to block the high speed operations if the absolute value of the supply voltage is about 3 V or less.

In order to cope with those difficulties, there is either an NTL (i.e., Non-Threshold Logic) circuit including a phase divider (or phase splitter) and an output emitter-follower circuit for transmitting an inverted output signal of the phase divider, or the so-called "SPL (i.e., Super Push-pull Logic) circuit (as should be referred to U.S. Pat. No. 4,999,520)", in which the output unit of the NTL circuit is replaced by an active pull-down circuit. In the NTL circuit of the prior art, however, the low power consumption of the high speed logic integrated circuit device is prevented because an operating current is steadily caused to flow in the phase divider and the output emitter-follower circuit. In the SPL circuit, on the other hand, the chip area of the high speed logic integrated circuit device is augmented because of the many circuit elements present. It is also found in each of the foregoing various logic circuits that the high speed logic integrated circuit device and accordingly the high speed computer cannot be given an efficient system structure because the logical functions to be realized are restricted.

Incidentally, an improved SPL circuit was filed as U.S. patent application Ser. No. 669,642 on Mar. 14, 1991 by Usami, one of the present inventors, and now abandoned in favor of the following continuing applications: U.S. patent application Ser. No. 929,917, filed Aug. 17, 1992 as a continuation application thereof (now U.S. Pat. No. 5,237,214); and U.S. patent application Ser. No. 739,195, filed Aug. 1, 1991 as a continuation-in-part application thereof (now U.S. Pat. No. 5,206,546).

SUMMARY OF THE INVENTION

An object of the present invention is to provide a high speed Bi-CMOS logic circuit having a lower operating current and less circuit elements and capable of operating with a low supply voltage.

Another object of the present invention is to reduce the power consumption and the chip area and to enhance the reliability of a high speed logic integrated circuit device or the like, which is constructed basically of the Bi-CMOS logic circuit, without deteriorating the high speed operation of the circuit device.

The foregoing and other objects and novel features of the present invention will become apparent from the following description to be made with reference to the accompanying drawings.

Representative aspects of the invention to be disclosed herein will now be briefly described.

A Bi-CMOS circuit to be packaged in a high speed logic integrated circuit device or the like comprises: an input transistor coupled to receive an input signal; an output transistor having an input coupled to receive the collector potential of the input transistor; variable impedance means, connected to the collector of the input transistor, including a parallel arrangement of a diode and a P-channel MOSFET which has its input coupled to receive an input signal; a current source including an N-channel MOSFET connected with the emitter of the input transistor and adapted to be selectively turned on in response to an input signal; and pull-down means including an N-channel MOSFET connected with the emitter of said output transistor and having an input coupled to receive the emitter potential of said input transistor.

According to the above-specified means, it is possible to realize a variety of high speed Bi-CMOS logic circuits having a more steady operating current and less circuit elements and capable of operating with a lower supply voltage. As a result, the high speed logic integrated circuit device or the like composed basically of the Bi-CMOS logic circuit can have its power consumption and chip area reduced and its reliability enhanced to make the system structure efficient without deteriorating the high speed operation of the circuit device.

BRIEF DESCRIPTION OF THE DRAWINGS

FIGS. 23(a) and 23(b) are circuit diagrams showing eighteenth and nineteenth embodiments of the Bi-CMOS logic circuit according to the present invention, respectively;

DETAILED DESCRIPTION OF THE PREFERRED EMBODIMENTS

Figure 1:
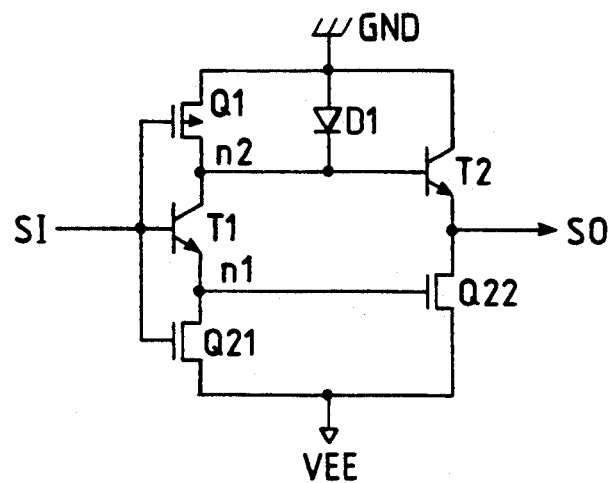
FIG. 1 is a circuit diagram showing a first embodiment of the Bi-CMOS logic circuit according to the present invention.
Figure 2:
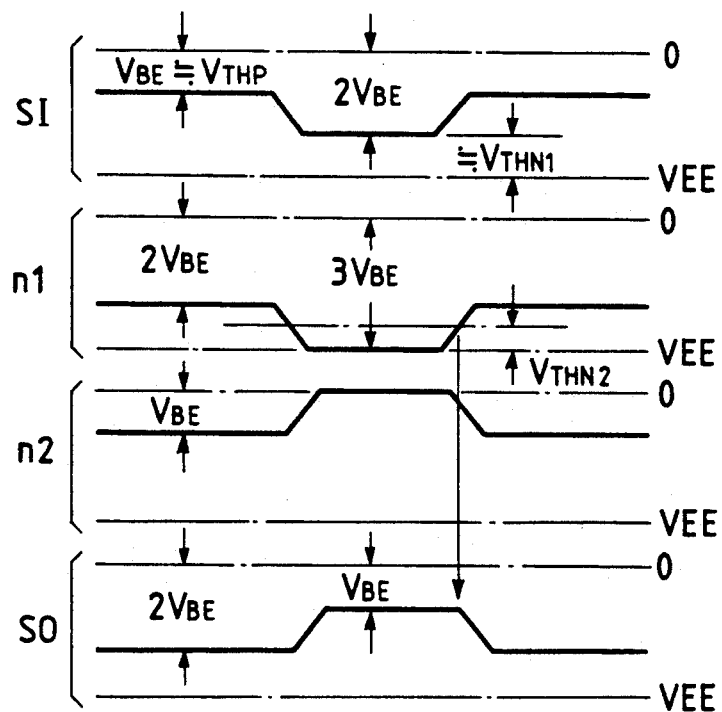
FIG. 2 is a signal waveform chart representative of an embodiment according to the Bi-CMOS logic circuit of FIG. 1.
Figure 3:
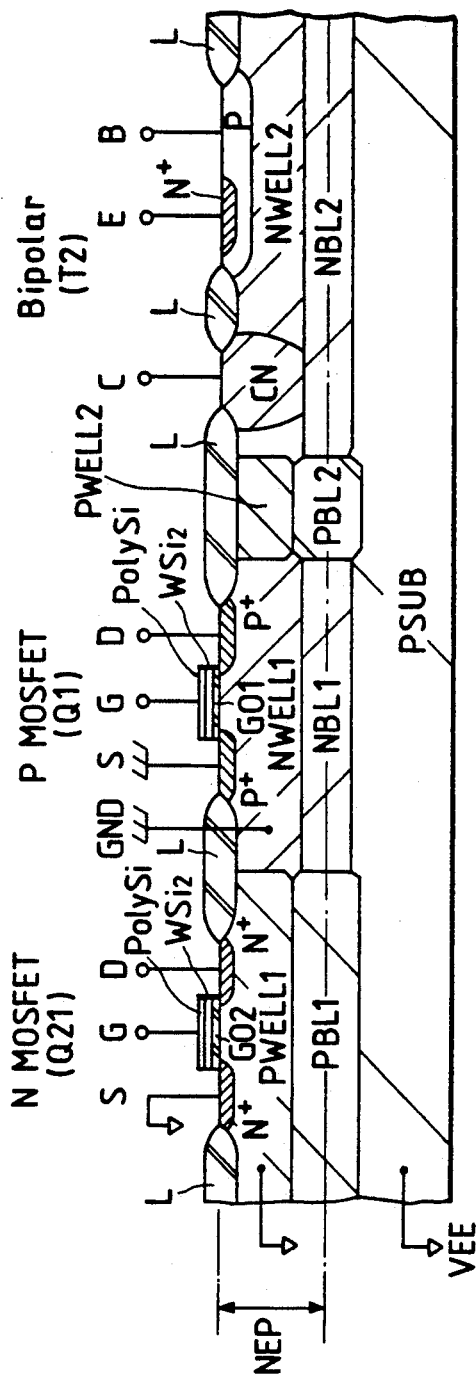
FIG. 3 is a section showing a device to be applied to the Bi-CMOS logic circuit of FIG. 1.
Figure 4:
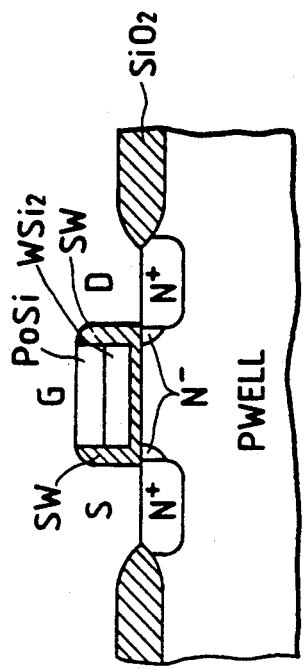
FIG. 4 is a section showing a device structure of one example of an N-channel MOSFET included in the Bi-CMOS logic circuit of the prior art.

FIG. 1 is a circuit diagram showing a first embodiment of a bipolar CMOS (i.e., Bi-CMOS) logic circuit according to the present invention, and FIG. 2 is a signal waveform chart representative of the embodiment of FIG. 1. FIG. 3 is a section showing the device structure of one embodiment of an N-channel MOSFET composing the Bi-CMOS logic circuit of FIG. 1, and FIG. 4 is a section showing one embodiment of the device structure of an N-channel MOSFET composing the Bi-CMOS logic circuit of the prior art. With reference to those figures, a brief explanation of the structure and operation of the Bi-CMOS logic circuit of this embodiment will be given below followed by a detailed description of the features of the same.

Incidentally, the Bi-CMOS logic circuit of each of the disclosed embodiments is packaged as a plurality of Bi-CMOS logic circuits in a high speed logic integrated circuit device constituting a high speed computer or the like, although not especially limited thereto. The individual circuit elements composing the Bi-CMOS logic circuit are formed, together with other circuit elements composing a high speed logic integrated circuit device, over a single P-type semiconductor substrate made of single crystal silicon or the like, although not especially limited thereto. In the following circuit diagrams, for purposes of illustration only, those MOSFETs (i.e., Metal Oxide Semiconductor Field Effect Transistors, as the MOSFETs will cover the insulated gate field effect transistors generally) using an arrow to indicate their channel (or back gate) portions are P-channel MOSFETs, and the MOSFETs without indicating arrows are N-channel MOSFETs, although not especially limited thereto. On the other hand, all the bipolar transistors, as shown, are NPN transistors, although not especially limited thereto.

In FIG. 1, the Bi-CMOS logic circuit of this embodiment includes: an input bipolar transistor T1 having its base coupled to an input receiving an input signal SI; and an output transistor T2 having its base coupled to receive the potential of an internal node n2, i.e., the collector of the input transistor T1, although not especially limited thereto.

The collector of the input transistor T1 is coupled to a ground potential GND (i.e., a first supply voltage) of the circuit through a source-drain path of a P-channel MOSFET Q1, although not especially limited thereto. The emitter of the input transistor T1, i.e., an internal node n1 is coupled to a supply voltage VEE (i.e., a second supply voltage) through a source-drain path of an N-channel MOSFET Q21. The individual gates of the MOSFETs Q1 and Q2 are commonly fed with the aforementioned input signal S1.

On the other hand, the output bipolar transistor T2 has its collector coupled to the ground potential GND of the circuit, although not especially limited thereto, and its emitter coupled to an output terminal S0 of the circuit and further to the supply voltage VEE through a source-drain path of an output N-channel MOSFET Q22.

Here, the supply voltage VEE is set, as shown in FIG. 2, to a value of about three times as high as a base-emitter voltage $V_{BE}$ of the bipolar transistor, namely, a negative supply voltage having an absolute value of 3 $V_{BE}$, although not especially limited thereto. Moreover, both the threshold voltage $V_{THP}$ of the MOSFET Q1 and the threshold voltage $V_{THN1}$ of the MOSFET Q21 are designed to a value substantially equal to the aforementioned base-emitter voltage $V_{BE}$, as will be described hereinafter. More preferably, the value $V_{THP}$ of the aforementioned MOSFET Q1 and the $V_{THN1}$ of the aforementioned MOSFET Q21 are set to a value slightly lower than the value $V_{BE}$ of the bipolar transistor. The threshold voltage $V_{THN2}$ of the MOSFET Q22 is designed to about one half of the threshold voltage $V_{THN1}$ of the aforementioned MOSFET Q21. As will be reasoned hereinafter, the input signal SI has its high level set to have an absolute value of a negative level corresponding to the aforementioned base-emitter voltage $V_{BE}$, i.e., $-V_{BE}$ and its low level set to have an absolute value of a negative level corresponding to twice the voltage value of the base-emitter voltage $V_{BE}$, i.e., $-2 V_{BE}$. In this embodiment, the aforementioned base-emitter voltage $V_{BE}$ and the threshold voltages $V_{THP}$ and $V_{THN2}$ are set at about 0.4 V. Thus, the supply voltage VEE is set at $-2.4$ V.

A more preferable design may be obtained in the following manner. Specifically, it is effective for speeding up the circuit not to cut off the MOSFET Q1 but to feed an extremely low current even if the input signal SI is at the high level of $-0.8$ V. This is because, if the MOSFET Q1 is completely cut off when the input signal is changed from the low to the high level, the channel portion of the MOSFET Q1 has to be changed from the non-inverted to inverted states at the time of changing the input signal from the high to low levels. As a result, it takes a long time for the channel portion of the MOSFET Q1 to be inverted again. In order to accelerate the operating speed of the circuit, therefore, the threshold voltage $V_{THP}$ of the MOSFET Q1 may be slightly lower than the absolute value of the difference between the source voltage (of 0 V) of the MOSFET Q1 and the high level (of $-0.8$ V) of the input signal SI. As a result, the value $V_{THP}$ may desirably be at about 0.5 V. The threshold voltage of the MOSFET Q21 may desirably be at about 0.5 V.

Moreover, it is desired that the N-channel MOSFET Q22 be substantially turned off, when the input signal SI is at the low level (of $-1.6$ V), and on when the input signal is at the high level (of $-0.8$ V). For this desire, the threshold voltage of the MOSFET Q22 may be set to a value around 0 V, e.g., 0 V to 0.3 V. This reason will be explained in the following. The MOSFET Q22 has a source potential of $-2.4$ V, a low gate potential of $-2.4$ V and a high gate potential of $-1.6$ V so that its source-gate voltage is at 0.8 V when its gate voltage is at the high level (of $-1.6$ V). If the source-gate voltage exceeds the threshold value, the MOSFET Q22 is turned on. Moreover, the threshold voltage of the MOSFET Q22 may desirably be in the vicinity of 0 V because a fine current is desired to flow when the gate voltage is at the low level (of $-2.4$ V).

The Bi-CMOS logic circuit of this embodiment further includes a diode D1 (acting as level setting means) connected in parallel with the aforementioned MOSFET Q1. Here, the diode D1 is so formed on the basis of a bipolar transistor that it has a forward voltage corresponding to the aforementioned base-emitter voltage $V_{BE}$.

As a result, the diode D1 coacts with the MOSFET Q1 as the variable impedance means for the input transistor T1. The diode D1 also acts as a clamp element for clamping the low level of the collector potential of the input transistor T1 at its forward voltage $V_{BE}$.

Specifically, when the input signal SI is at the high level, the MOSFET Q1 is substantially turned off, and the anode-cathode potential of the diode D1 is clamped substantially at the value $V_{BE}$. When the input signal SI is at the high level, the variable impedance means has its impedance set substantially to a value as high as the ON resistance of the diode D1. When the input signal is at the low level, on the other hand, the MOSFET Q1 is turned on, whereas the diode D1 is turned off. As a result, the impedance of the variable impedance means is set to a value as low as the ON resistance of the MOSFET Q1. Moreover, the diode D1 and the MOSFET Q1 constitute, together with the input transistor T1 and the MOSFET Q21, a phase inversion unit (which may be called a phase splitter or an input circuit unit) of the Bi-CMOS logic circuit, and the output transistor T2 and the MOSFET Q22 constitute the load drive unit or output circuit unit. At this time, the MOSFET Q21 acts as a current source, if it is turned on, and the MOSFET Q22 acts as a pulldown element if it is turned on. Moreover, the potential of the emitter of the transistor T1, i.e., the internal node n1 is used as the non-inverted output signal of the phase decision unit, and the potential of the collector of the transistor T1, i.e., the internal node n2, is used as the inverted output signal.

When the input signal SI is set to the high level, e.g., $-V_{BE}$, the MOSFET Q1 is substantially turned off, and the MOSFET Q21 is turned on. As a result, the input transistor T1 is fed through the diode D1 and the MOSFET Q21 with a predetermined operating current corresponding to the conductance of the MOSFET Q21. As shown in FIG. 2, the non-inverted output signal n1 of the phase decision unit is set to a high level of $-2 V_{BE}$, which is lower by the base-emitter voltage $V_{BE}$ of the input transistor T1 than the high level of the input signal SI. Moreover, the inverted output signal n2 of the phase decision unit is decreased by feeding the operating current to the input transistor T1 but is set to the low level of $-V_{BE}$ by the clamping action of the diode D1. As a result, the output signal S0 of the Bi·CMOS logic circuit is set to the low level of $-2 V_{BE}$, which is lower by the base-emitter voltage $V_{BE}$ of the output transistor T1 than the low level of the aforementioned inverted output signal n2. At this time, the MOSFET Q22 is turned on, when the non-inverted output signal n1 of the phase decision unit is set to the high level, e.g., $-2 V_{BE}$, to quickly discharge the load capacitance coupled to the output terminal S0 of the circuit.

If, on the other hand, the input signal SI is set to the low level, e.g., $-2 V_{BE}$, the MOSFET Q21 is substantially turned off, but the MOSFET Q1 is turned on. As a result, the input transistor T1 allows a slight current to flow therethrough. Thus, the non-inverted output signal n1 of the phase decision unit is set, as shown in FIG. 2, to the low level of $-3 V_{BE}$, which is lower by the base-emitter voltage $V_{BE}$ of the input transistor T1 than the input signal SI, and the inverted output signal n2 of the same is set to the high level substantially equal to the ground potential of the circuit. As a result, the output signal S0 of the Bi·CMOS logic circuit is set to the high level of $-V_{BE}$, which is lower by the base-emitter voltage $V_{BE}$ of the output transistor T2 than the high level of the aforementioned inverted output signal n2. At this time, the MOSFET Q22 is turned off to feed no discharge current because the non-inverted output signal n1 of the phase decision unit is set to the low level of $-3 V_{BE}$.

As has been described hereinbefore, the Bi·CMOS logic circuit of this embodiment includes: the input transistor T1 which receives the input signal SI; the output transistor T2 coupled to receive the collector potential of the input transistor T1, i.e., the inverted output signal n2 of the phase decision unit; the P-channel MOSFET Q1 and the diode D1 connected in parallel between the ground potential of the circuit and the collector of the input transistor T1; the N-channel MOSFET Q21 connected between the emitter of the input transistor T1 and the supply voltage VEE; and the N-channel MOSFET Q22 connected between the emitter of the output transistor T2 and the supply voltage VEE. In this embodiment, the supply voltage VEE is set to a negative supply voltage having an absolute value equal to three times the base-emitter voltage $V_{BE}$ of the bipolar transistor. Moreover, the MOSFETs Q1 and Q21 have a lower threshold voltage, e.g., 0.5 V, than the aforementioned base-emitter voltage $V_{BE}$, and the MOSFET Q22 has a threshold voltage equal to one half of the same. Moreover, the MOSFETs Q1 and Q21 have their gates fed with the input signal SI, and the MOSFET Q22 has its gate fed with the emitter potential of the input transistor T1, i.e., the non-inverted output signal of the phase decision unit. From these, it follows that the MOSFET Q1 coacts with the diode D1 as the variable impedance means and also selectively as the pull-up element if the input signal SI is set to the low level. On the other hand, the MOSFET Q21 acts selectively as the current source, if the input signal SI is at the high level, and the MOSFET Q22 acts selectively as the pull-down element if the non-inverted output signal of the phase decision unit is at the high level, that is, if the input signal SI is at the high level. Thus, the aforementioned six circuit element can realize the Bi·CMOS logic circuit which has a low steady operating current and can operate at a high speed. As a result, it is possible to reduce the chip area of the high speed logic integrated circuit device constructed basically of the Bi·CMOS logic circuit and to reduce the power consumption and accelerate the speed of the same circuit device. Since, moreover, the supply voltage VEE is set to have a low absolute value, e.g., about 2.4 V, it is needless to say that the production of hot carriers is suppressed to enhance the reliability of the high speed logic integrated circuit device.

Incidentally, in the Bi·CMOS logic circuit of this embodiment, as is apparent from FIG. 2, the voltage (of 2.4 V) corresponding to the absolute value of the supply voltage VEE is not applied between the source and drain of each MOSFET. Thus, the MOSFETs Q1, Q21, Q22 and so on composing the Bi·CMOS logic circuit of this embodiment can be formed, as represented by the N-channel MOSFET of FIG. 3, of a device structure which neither requires a side wall insulating film SW made of a silicon oxide film nor a light doped $N^-$-type source (or drain) region. Specifically, the N-channel MOSFETs or the like composing the Bi·CMOS logic circuit of the prior art are made to have the so-called "LDD (i.e., Lightly Doped Drain) structure". In this LDD structure, as exemplified in FIG. 4, the side wall SW is formed along a poly-silicon layer PoSi or the like forming a gate G, and a predetermined $N^-$-type region is formed below the side walls SW, i.e., between the channel portion and $N^+$-type regions forming a source S and a drain D. As a result, the production of the hot carriers is suppressed to enhance the reliability of the LDD structure. With the side walls SW or the $N^-$-type regions being formed, however, there arises problems including that the manufacture process of the high speed logic integrated circuit device is complicated and that the MOSFETs have their conductances lowered. In the Bi·CMOS logic circuit of this embodiment, as has been described hereinbefore, a voltage corresponding to the absolute value of the supply voltage VEE is not applied between the source and drain of each MOSFET so that the logic circuit need not be formed with such side walls SW and the $N^-$-type regions. As a result, at least two steps of the manufacture process of the high speed logic integrated circuit device can be eliminated while preventing the reduction of the conductances of the MOSFETs so that the high integration of the circuit device can be accordingly promoted.

A more detailed description will be made with reference to FIG. 3. Incidentally, the N-channel MOSFET, P-channel MOSFET and NPN bipolar transistors having the structures, as shown in FIG. 3, are applied to the Bi·CMOS logic circuit of the present invention, as shown in FIG. 1, FIG. 5 and FIGS. 7 to 23(b).

As shown in FIG. 3, the device constituting the Bi·CMOS logic circuit of the present invention is formed, for example, over a P-type semiconductor substrate PSUB. The P-channel MOSFET (or PMOSFET) Q1 and the bipolar transistor (or Bipolar) T2 are formed in N-type well regions NWELL1 and NWELL2, which in turn are formed over N-type buried layers NBL1 and NBL2. The P-channel MOSFET Q1 is formed of: a pair of $P^+$-type regions formed in the aforementioned N-type well region NWELL1 and acting as source and drain regions; and a gate electrode G made of a gate oxide film G01 and of tungsten silicide ($WSi_2$) and polycrystalline silicon (Poly-Si) over the gate oxide film G01. On the other hand, the bipolar transistor T2 is formed of: a highly doped N-type region CN for leading out the collector electrode; a P-type base region P and a highly doped N-type emitter region N+ formed in the P-type base region P.

On the other hand, the N-channel MOSFET (or N-MOSFET) Q21 is formed in a P-type well region PWELL1 formed over the P-type buried layer PBL1. The N-channel MOSFET Q21 is formed of: a pair of N+-type regions formed in the aforementioned P-type well region PWELL1 and acting as source and drain regions; and a gate electrode G made of a gate oxide film G02 and of tungsten silicide (WSi$_2$) and polycrystalline silicon (Poly-Si).

Between the aforementioned bipolar transistor T2 and P-channel MOSFET Q1, there are formed a P-type buried layer PBL2 and a P-type well region PWELL2 acting as an isolation layer for isolating the former two electrically. On the principal surface of a semiconductor substrate 1, on the other hand, there is formed a field oxide film L which is prepared by the local oxidation of silicon (i.e., LOCOS) method for isolating the N-channel MOSFET Q21, the P-channel MOSFET Q1 and the bipolar transistor T2.

The device shown in FIG. 3 is formed by a process having the following steps.

First of all, the P-type semiconductor substrate PSUB is prepared and formed selectively with an oxidation resisting film such as a nitride film (Si$_3$N$_4$) in its region to be formed with the P-type buried layers PBL1 and PBL2. Then, those oxidation resisting films are used as an impurity implanting mask to dope the semiconductor substrate PSUB with an impurity (e.g., antimony Sb) for forming the N-type buried layers NBL1 and NBL2 and so on. Then, the surface of the aforementioned semiconductor substrate PSUB is thermally oxidized to grow an oxide film at its portion exposed from the nitride film. Next, this nitride film is removed, and the aforementioned oxide film is used as an impurity implanting mask to implant the substrate surface with ions of boron B. After this, the oxide film is removed from the substrate surface to form an N-type silicon epitaxial layer NEP.

Next, by using steps similar to those of forming the N-type buried layers NBL1 and NBL2 and the P-type buried layers PBL1 and PBL2, the N-type well regions NWELL1 and NWELL2 and the P-type well regions PWELL1 and PWELL2 are formed, and the field oxide film L is further formed on the substrate surface. After this, the gate oxide films G01 and G02 and so on are formed. Next, an impurity of boron is introduced to control the threshold voltage V$_{TH}$ of the MOSFET as low as that of the MOSFET Q22 of FIG. 1. This impurity introducing step is applied to the regions to be formed with all MOSFETs. Next, an impurity of boron is introduced into the regions to be formed with only the aforementioned MOSFETs Q1 and Q21 so as to control the threshold voltage V$_{TH}$ of the MOSFET as high as that of the MOSFETs Q1 and Q21 of FIG. 1. Over those gate oxide films G01 and G02 and so on, there is selectively formed a gate electrode which is made of tungsten silicide (WSi$_2$) and polycrystalline silicon (Poly-Si). Thus, the highly doped N-type layer CN for leading out the collector electrode is formed by introducing phosphor, and the base region P is formed by introducing boron.

By using the gate electrode G over the aforementioned gate oxide film G02 as a mask, moreover, ions of arsenic As are introduced to form the source and drain regions N+ of the N-channel MOSFET Q21 and so on. By using the gate electrode G over the gate oxide film G01, moreover, boron B is introduced to form the source and drain regions P+ of the P-channel MOSFET Q1 and so on. In order to form the emitter region N+ of the bipolar transistor, furthermore, arsenic As is selectively introduced into the aforementioned base region. As a result of those steps, one semiconductor substrate can be formed thereover with the bipolar transistor and the single-drain N-channel MOSFET and P-channel MOSFET. Since, on the other hand, the threshold voltage will change with the impurity concentration of the channel portions, the impurity concentration of the channel portions may be controlled by using two masks so that two kinds of MOSFETs Q21 and Q22 having different threshold voltages may be formed.

Figure 5:
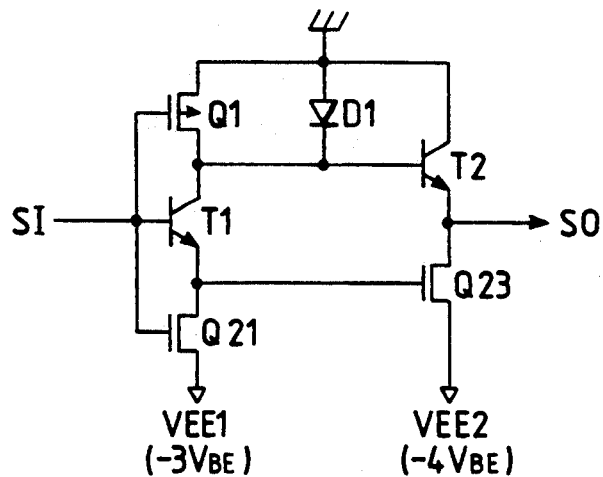
FIG. 5 is a circuit diagram showing a second embodiment of the Bi-CMOS logic circuit according to the present invention.
Figure 6:
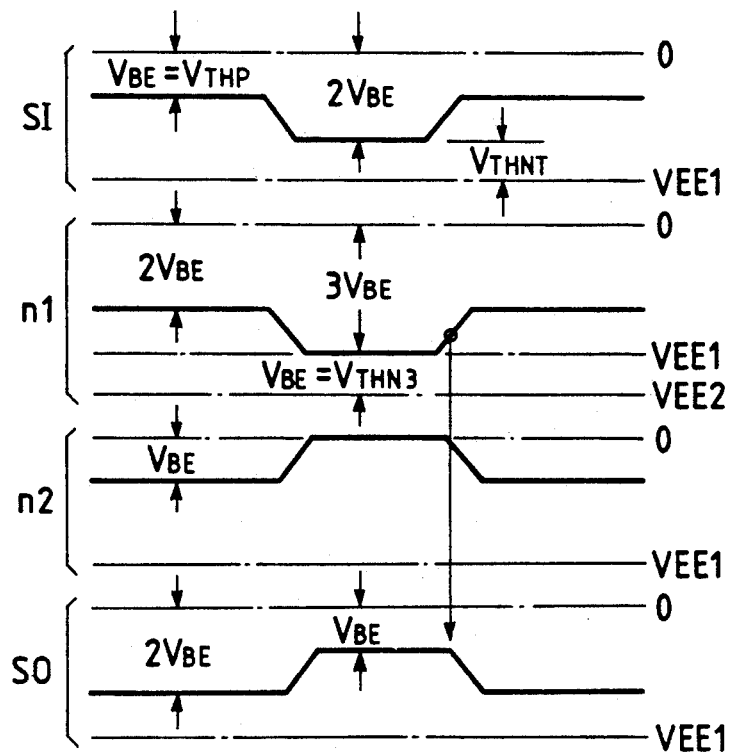
FIG. 6 is a signal waveform chart representative of an embodiment according to the Bi-CMOS logic circuit of FIG. 5.

FIG. 5 is a circuit diagram showing a second embodiment of the Bi-CMOS logic circuit according to the present invention, and FIG. 6 is a waveform chart showing the signals of the embodiment. Incidentally, a plurality of the embodiments to be described beginning with the following embodiment basically follow from the aforementioned embodiment of FIG. 1. Therefore, a detailed description of each will only be directed to those portions thereof that are different from that of the first embodiment.

In FIG. 5, a Bi-CMOS logic circuit of this embodiment is constructed of: a phase decision unit composed of the input transistor T1, the MOSFETs Q1 and Q21 and the diode D1; and a load drive unit composed of the output transistor T2 and an N-channel MOSFET Q23. The MOSFET Q21 has its source coupled to a supply voltage VEE1 (i.e., a second supply voltage). On the other hand, the MOSFET Q23 has its gate coupled to the emitter of the input transistor T1, i.e., the non-inverted output node n1 of the phase decision unit and its source coupled to a supply voltage VEE2 (i.e., a third supply voltage).

Here, the supply voltage VEE1 is designed, as shown in FIG. 6, to have an absolute value corresponding to a value three times as high as the base-emitter voltage V$_{BE}$ of the bipolar transistor, i.e., 3 V$_{BE}$, and the supply voltage VEE2 is designed to have an absolute value corresponding to a value four times as high as the same, i.e., 4 V$_{BE}$, although not especially limited thereto. Moreover, the MOSFETs Q1 and Q21 are designed to have lower threshold voltages V$_{THP}$ and V$_{THN1}$, e.g., 0.5 V, than the aforementioned base-emitter voltage V$_{BE}$, and the MOSFET Q23 is designed to have a similar threshold voltage V$_{THN3}$.

The MOSFET Q23 resultantly performs an action similar to that of the MOSFET Q22 of the aforementioned Bi-CMOS logic circuit of FIG. 1 to generate an output signal waveform similar to the aforementioned one of FIG. 2. In the case of the present embodiment, however, the MOSFET Q23 is formed not as a MOSFET having a lower threshold but rather as an ordinary MOSFET so that the manufacture process of the high speed logic integrated circuit device is simplified. Specifically, the two impurity introducing steps are required in the aforementioned manufacture process but can be reduced to one by equalizing the threshold values of the N-channel MOSFETs used in the input circuit unit and the output circuit unit. The driving ability as the Bi-CMOS logic circuit is increased accordingly as the absolute value of the supply voltage VEE2 is increased.

Figure 7:
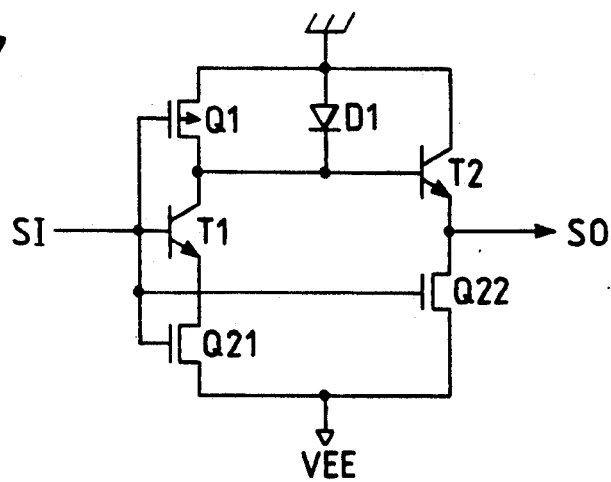
FIG. 7 is a circuit diagram showing a third embodiment of the Bi-CMOS logic circuit according to the present invention.

FIG. 7 is a circuit diagram showing a third embodiment of the Bi-CMOS logic circuit according to the present invention.

In FIG. 7, the MOSFET Q22 acting as the pull-down element has its gate coupled commonly to the base of the input transistor T1 so that it is fed directly with the input signal SI. Thus, the MOSFET Q22 has its gate fed with the input signal SI which is not reduced by the base-emitter voltage $V_{BE}$ of the input transistor T1. As a result, the MOSFET Q22 can be formed as an ordinary MOSFET having the same threshold voltage as that of the MOSFET Q21, notwithstanding that its source is coupled to the supply voltage VEE.

Figure 8:
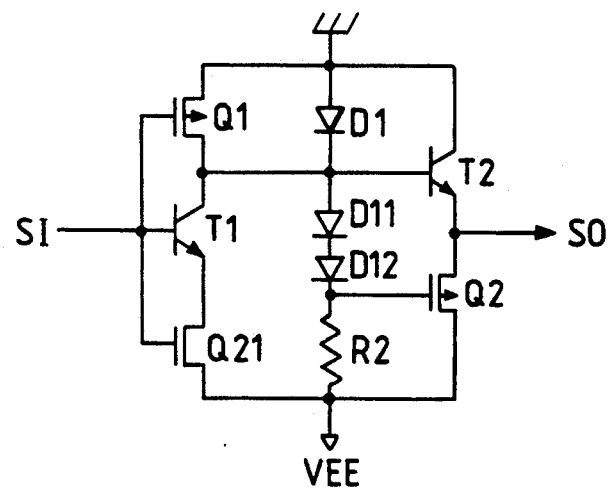
FIG. 8 is a circuit diagram showing a fourth embodiment of the Bi-CMOS logic circuit according to the present invention.

FIG. 8 is a circuit diagram showing a fourth embodiment of the Bi-CMOS logic circuit according to the present invention.

In FIG. 8, the pull-down MOSFET connected between the output terminal SO of the circuit and the supply voltage VEE is replaced by the P-channel MOSFET Q2. This MOSFET Q2 has its gate coupled to the collector of the input transistor T1, i.e., the inverted output node of the phase decision unit through diodes D11 and D12 connected in series. Moreover, a resistor R2 is connected between the gate of the aforementioned MOSFET Q2 and the aforementioned supply voltage VEE. As a result, the MOSFET Q2 is selectively turned on under a complementary condition with the aforementioned MOSFET Q22 of FIG. 1, to selectively discharge a load capacitor to be coupled to the output terminal SO of the circuit.

Figure 9:
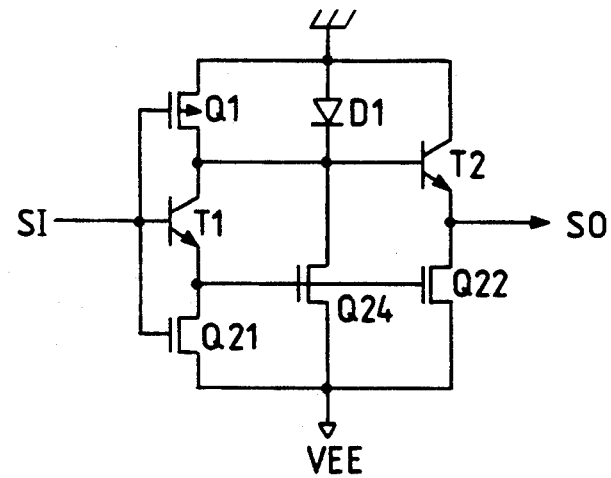
FIG. 9 is a circuit diagram showing a fifth embodiment of the Bi-CMOS logic circuit according to the present invention.

FIG. 9 is a circuit diagram showing a fifth embodiment of the Bi-CMOS logic circuit according to the present invention.

In FIG. 9, the Bi-CMOS logic circuit includes, in addition to the circuit elements of FIG. 1, an N-channel MOSFET Q24 which is connected between the collector of the input transistor T1 and the supply voltage VEE. The MOSFET Q24 has its gate coupled to the emitter of the input transistor T1, i.e., the non-inverted output node of the phase decision unit. Like the MOSFET Q22, moreover, the MOSFET Q24 has a threshold voltage corresponding to one half of the base-emitter voltage $V_{BE}$ of the bipolar transistor.

Thus, the MOSFET Q24 is turned on simultaneously with the pull-down MOSFET Q22 to extract the base charge of the output transistor T2 when the non-inverted output signal of the phase decision unit is at the high level, that is, when the input signal SI is at the high level whereas the output signal SO is at the low level. As a result, the output transistor T2 is substantially cut off to accelerate the low level change of the output signal SO.

Incidentally, it could be easily understood that the MOSFET Q24 of FIG. 9 may be incorporated into the individual logic circuits shown in FIGS. 5, 7 and 8 and the later-described individual logic circuits of FIGS. 10, 11, 12 and 13 and FIG. 15.

Figure 10:
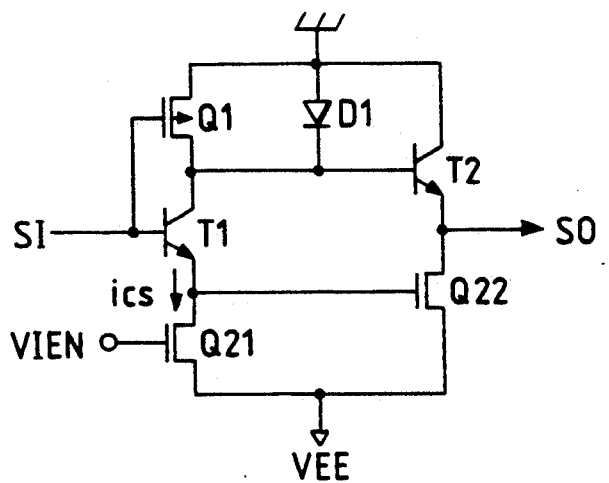
FIG. 10 is a circuit diagram showing a sixth embodiment of the Bi-CMOS logic circuit according to the present invention.

FIG. 10 is a circuit diagram showing a sixth embodiment of the Bi-CMOS logic circuit according to the present invention.

In FIG. 10, the base of the input transistor T1 and the gate of the P-channel MOSFET Q1 composing the phase decision unit are commonly fed with the input signal SI, and the gate of the N-channel MOSFET Q21 is fed with a predetermined constant voltage VIEN from a not-shown voltage generator VGN of the high speed logic integrated circuit device. As a result, the MOSFET Q1 coacts with the diode D1 as the variable impedance means and selectively as a pull-up element if the input signal SI is at the low level. On the other hand, the MOSFET Q21 is steadily made operative as a current source to feed the input transistor T1 with a predetermined operating current $i_{CS}$ according to the aforementioned constant voltage VIEN.

Here, the voltage generator VGN for generating the aforementioned constant voltage VIEN is composed, as shown in FIG. 14, of a P-channel MOSFET Q4, a transistor T3 and a resistor R1, which are connected in series between the ground potential of the circuit and the supply voltage VEE, although not especially limited thereto. Of these, the transistor T3 has its base fed with a predetermined constant voltage VCS from the not-shown constant voltage generator of the high speed logic integrated circuit device. The constant voltage VCS is such a stable supply voltage as suppresses the fluctuations due to the manufacture process or ambient temperature of the high speed logic integrated circuit device.

On the other hand, the MOSFET Q4 has its gate coupled commonly to its drain and further to the gate of a P-channel MOSFET Q5. This MOSFET Q5 has its source coupled to the ground potential of the circuit and its drain coupled to the supply voltage VEE through an N-channel MOSFET Q27. This MOSFET Q27 has its gate coupled commonly to its drain and further coupled commonly to the gates of a plurality of N-channel MOSFETs which are made receptive of the constant voltage VIEN. As a result, the MOSFET Q4 forms a current mirror mode with the MOSFET Q5 and a diode mode with the MOSFET Q27. As a result, a current i to be fed to the MOSFET Q4 through the transistor T3 unchangedly becomes the source-drain current of the MOSFET Q5 so that the phase decision unit of the Bi-CMOS logic circuit of FIG. 10 is fed through the aforementioned MOSFET Q21 with the operating current $i_{CS}$ corresponding to the constant voltage VIEN.

As is well known in the art, the transistor T3 has an emitter potential $V_{E3}$ generally expressed by the following Equation:

$$V_{E3} = VCS - V_{BE},$$

and a current i generally expressed by the following Equation:

$$i = \frac{V_{E3} - VEE}{R1} \tag{1}$$

$$= \frac{VCS - V_{BE} - VEE}{R1}.$$

On the other hand, the constant voltage VIEN is expressed by the following Equation, if the MOSFET Q27 has a gate-source voltage $V_{GS}$:

$$VIEN = VEE + V_{GS}.$$

The gate-source voltage $V_{GS}$ and the current i have the following relation:

$$i = \frac{\beta_{N1}}{2}(V_{GS} - V_{THN})^2, \tag{2}$$

wherein: the following Equation holds among a carrier mobility $\mu$, an oxide film capacitance CO, a gate width W and a gate length L:

$$\beta_{N1} = \frac{1}{\mu C_o} \cdot \frac{W}{L}.$$

Hence, the Equation (2) can be rewritten into the following Equation:

$$V_{GS} = \left[\frac{2i}{\beta_{N1}}\right]^{\frac{1}{2}} + V_{THN}.$$

Thus, the constant voltage VIEN is expressed by the following Equation:

$$VIEN = VEE + \left[\frac{2i}{\beta_{N1}}\right]^{\frac{1}{2}} + V_{THN}. \tag{3}$$

In the Bi-CMOS logic circuit, on the other hand, the current $i_{CS}$ to flow through the MOSFET Q21 is expressed by the following Equation:

$$i_{cs} = \frac{\beta_{N2}}{2}(VIEN - VEE - V_{THN})^2,$$

because the MOSFET Q21 has the gate-source voltage $V_{GS}$ expressed by the following equation:

$$V_{GS} = VIEN - VEE.$$

The current $i_{CS}$ can be rewritten into the following equation by substituting the Equations (3) and (1) sequentially into the above Equation:

$$i_{cs} = \frac{\beta_{N2}}{2}\left(\frac{2i}{\beta_{N1}}\right) \tag{4}$$

$$= \frac{\beta_{N2}}{\beta_{N1}R1}(VCS - V_{BE} - VEE).$$

This Equation (4) does not contain the term of the threshold voltage $V_{THN}$ of the MOSFET, as has already been apparent. The operating current $i_{CS}$ of the phase decision unit of the Bi-CMOS logic circuit, which is obtained through the MOSFET Q21, can compensate the fluctuations of the threshold voltage of the MOSFET due to the manufacture process of the high speed logic integrated circuit device. As a result, the phase decision unit of the Bi-CMOS logic circuit of this embodiment is fed with the stable operating current set by the aforementioned Equation (4) so that its operations are stabilized.

Figure 11:
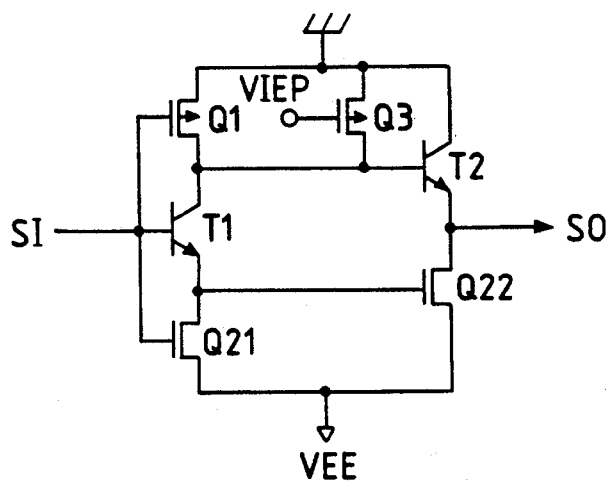
FIG. 11 is a circuit diagram showing a seventh embodiment of the Bi-CMOS logic circuit according to the present invention.

FIG. 11 is a circuit diagram showing a seventh embodiment of the Bi-CMOS logic circuit according to the present invention.

In FIG. 11, the diode D1 constituting the phase decision unit, i.e., the level setting means is replaced by a P-channel MOSFET Q3, which is fed with a predetermined constant voltage VIEP from a not-shown voltage generator VGP of the high speed logic integrated circuit device. As a result, the MOSFET Q3 acts as an impedance for the predetermined current $i_{CS}$ according to the aforementioned constant voltage VIEP and constitutes the variable impedance means together with the MOSFET Q1. At this time, the amplitude of the inverted output signal of the phase decision unit, i.e., the output signal SO of the Bi-CMOS logic circuit is arbitrarily set by the resistance of the MOSFET Q3, i.e., the value of the operating current $i_{CS}$.

Here, the voltage generator VGP for generating the aforementioned constant voltage VIEP is composed, as shown in FIG. 14, of: the aforementioned voltage generator VGN; and a P-channel MOSFET Q6 and an N-channel MOSFET Q28, which are connected in series between the ground potential of the circuit and the supply voltage VEE, although not especially limited thereto. Of these, the MOSFET Q28 has its gate coupled commonly to the gate and drain of the MOSFET Q27 so that it takes a current mirror mode together with the MOSFET Q27. On the other hand, the MOSFET Q6 is in a diode mode. As a result, the current i to be fed through the transistor T3 is transmitted to the MOSFET Q27 through the MOSFETs Q4 and Q5 in the current mirror mode and further to the MOSFET Q6 through the MOSFETs Q27 and Q28 in the current mirror mode. The potential at the gate and drain of the MOSFET Q6 is fed as the constant voltage VIEP to the base of the aforementioned MOSFET Q3 or the like so that the predetermined current $i_{CS}$ is obtained.

As is well known in the art, the gate-source voltage $V_{GSP}$ of the MOSFET Q6 is expressed by the following Equation:

$$V_{GSP} = \left[\frac{2i}{\beta_{P1}}\right]^{\frac{1}{2}} + V_{THP},$$

and the aforementioned constant voltage VIEP is expressed by the following Equation:

$$VIEP = V_{GSP} \tag{5}$$

$$= \left[\frac{2i}{\beta_{P1}}\right]^{\frac{1}{2}} + V_{THP}.$$

In the Bi-CMOS logic circuit, on the other hand, the current $i_{CS}$ to flow through the MOSFET Q3 is expressed by the following Equation:

$$i_{cs} = \frac{\beta_{P2}}{2}(VIEP - V_{THP})^2,$$

because the MOSFET Q21 has the gate-source voltage $V_{GSP}$ expressed by the following equation:

$$V_{GSP} = VIEP.$$

The current $i_{CS}$ can be rewritten into the following equation by substituting the Equations (5) and (1) sequentially into the above Equation:

$$i_{cs} = \frac{\beta_{P2}}{2}\left(\frac{2i}{\beta_{P1}}\right) \tag{6}$$

$$= \frac{\beta_{P2}}{\beta_{P1}R1}(VCS - V_{BE} - VEE).$$

This Equation (6) does not contain the term of the threshold voltage $V_{THP}$ of the MOSFET, as has already been apparent. The operating current $i_{CS}$ of the phase decision unit of the Bi-CMOS logic circuit, which is obtained through the MOSFET Q3, can compensate the fluctuations of the threshold voltage of the MOSFET due to the manufacture process of the high speed logic integrated circuit device. As a result, the amplitude of the output signal SO can be arbitrarily set to the stable value in accordance with the Equation (6), and the operations of the Bi-CMOS logic circuit can be stabilized.

Figure 12:
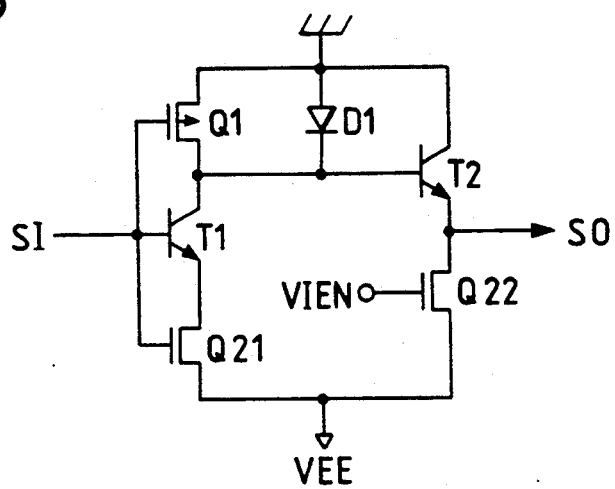
FIG. 12 is a circuit diagram showing an eighth embodiment of the Bi-CMOS logic circuit according to the present invention.

FIG. 12 is a circuit diagram showing an eighth embodiment of the Bi-CMOS logic circuit according to the present invention.

In FIG. 12, the N-channel MOSFET Q22 disposed in a load drive unit of the Bi-CMOS logic circuit is fed with the constant voltage VIEN from the aforementioned voltage generator VGN. As a result, the MOSFET Q22 acts as a load for the output transistor T2 and steadily feeds a predetermined pull-down current according to the aforementioned constant voltage VIEN to discharge the load capacitor coupled to the output terminal SO.

Figure 13:
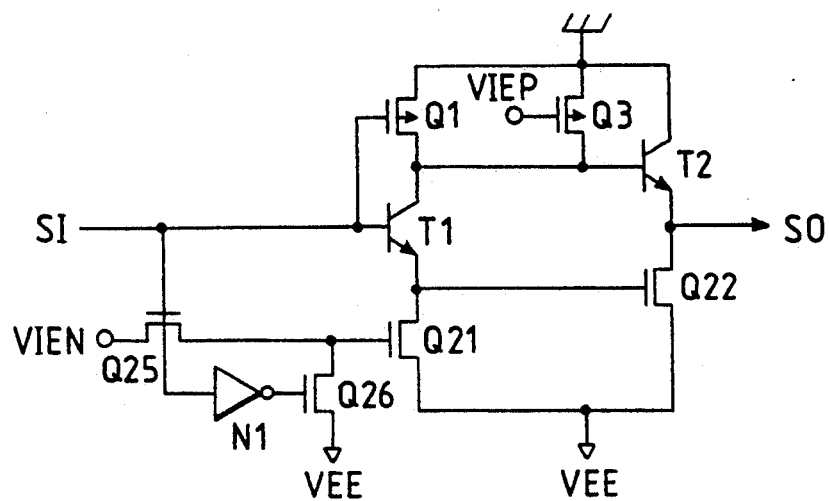
FIG. 13 is a circuit diagram showing a ninth embodiment of the Bi-CMOS logic circuit according to the present invention.
Figure 14A:
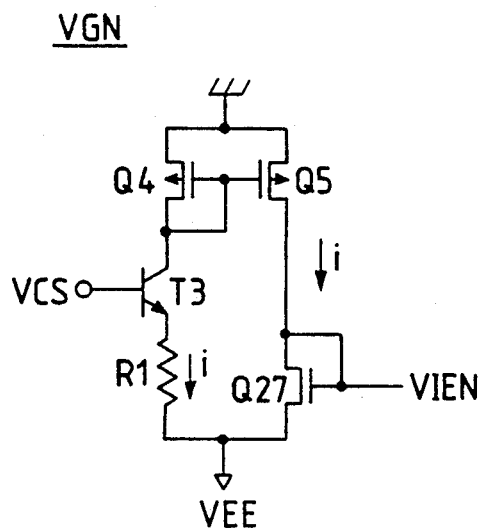
FIGS. 14(a) and 14(b) are circuit diagrams showing embodiments of a voltage generator for supplying predetermined constant voltages to the Bi-CMOS logic circuit according to the present invention.
Figure 14B:
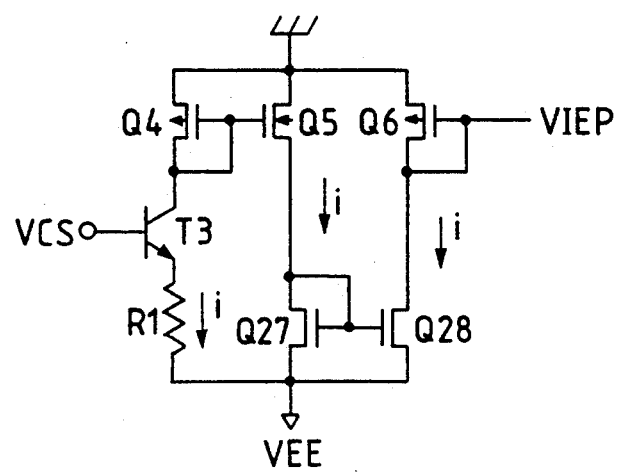

FIG. 13 is a circuit diagram showing a ninth embodiment of the Bi-CMOS logic circuit according to the present invention.

In FIG. 13, the variable impedance means of the Bi-CMOS logic circuit is composed, like the aforementioned embodiment of FIG. 11, of the P-channel MOSFET Q1 having its gate coupled to receive the input signal SI, and the P-channel MOSFET Q3 having its gate receiving the aforementioned constant voltage VIEP. Moreover, the N-channel MOSFET Q21 composing the current source of the phase decision unit of the Bi-CMOS logic circuit has its gate fed with the aforementioned constant voltage VIEN through an N-channel MOSFET Q25 having its gate coupled to receive the input signal SI. Between the gate of the MOSFET Q21 and the supply voltage VEE, there is connected an N-channel type pull-down MOSFET Q26 which has its gate coupled to an output of a logic inverter the input of which is coupled to receive the input signal SI.

As a result, when the input signal SI is at the high level to turn on the MOSFET Q25, the MOSFET Q21 is turned on to feed the predetermined operating current $i_{CS}$. As a result, with the selective actuation of MOSFET Q21, the operating current of the phase decision unit is reduced to promote the lower power consumption of the Bi-CMOS logic circuit, as compared with the case in which the MOSFET Q21 is steadily turned on, as in the embodiment of FIG. 10.

Figure 15:
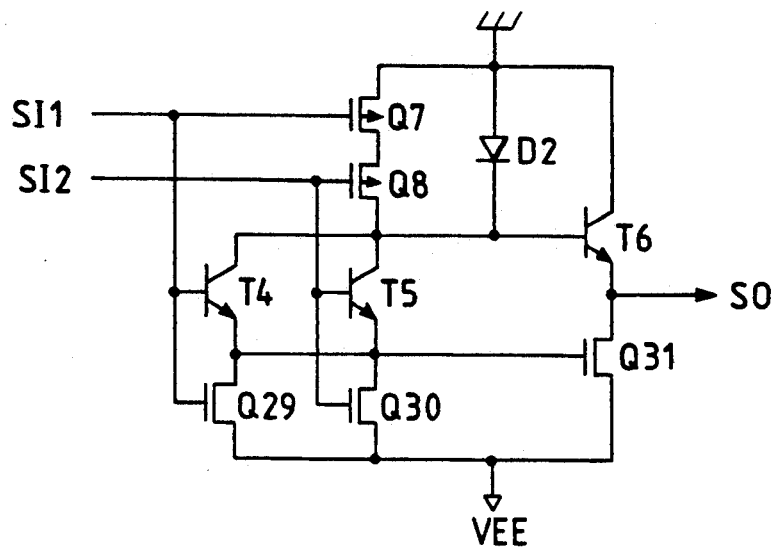
FIG. 15 is a circuit diagram showing a tenth embodiment of the Bi-CMOS logic circuit according to the present invention.

FIG. 15 is a circuit diagram showing a tenth embodiment of the Bi-CMOS logic circuit according to the present invention.

In FIG. 15, the Bi-CMOS logic circuit of this embodiment includes two input transistors T4 and T5 connected in parallel, although not especially limited thereto. These input transistors have their commonly coupled collectors coupled to the ground potential of the circuit through two P-channel MOSFETs Q7 and Q8 connected in series and their commonly coupled emitters coupled to the supply voltage VEE through two N-channel MOSFETs Q29 and Q30 connected in parallel. The base of the input transistor T4 and the gates of the MOSFETs Q7 and Q29 are commonly coupled and fed with an input signal SI1. Moreover, the base of the input transistor T5 and the gates of the MOSFETs Q8 and Q39 are commonly coupled and fed with an input signal SI2.

The Bi-CMOS logic circuit further includes a diode D2 (or level setting means) connected in parallel with the MOSFETs Q7 and Q8. The diode D2 coacts with the aforementioned MOSFETs Q7 and Q8 as the variable impedance means of the Bi-CMOS logic circuit and constitutes the phase decision unit of the Bi-CMOS logic circuit together with the input transistors T4 and T5 and the MOSFETs Q29 and Q30.

The potential of the commonly coupled collectors of the input transistors T4 and T5, i.e., the inverted output of the phase decision unit is fed to the base of the output transistor T6. On the other hand, the potential of the commonly coupled emitters of the input transistors T4 and T5, i.e., the non-inverted output signal of the phase decision unit is fed to the gate of an N-channel MOSFET Q31, although not especially limited thereto. The MOSFETs Q7 and Q8 and the MOSFETs Q29 and Q30 are designed to have a threshold voltage corresponding to the base-emitter voltage $V_{BE}$ of the bipolar transistor, and the MOSFET Q31 is designed to have a threshold voltage corresponding to one half of the former.

When either the input signal SI1 or SI2 is at the high level such as $-V_{BE}$, either the corresponding MOSFET Q7 or Q8 in the Bi-CMOS logic circuit is turned off, whereas either the MOSFET Q29 or Q30 is turned on. As a result, the potential of the commonly coupled collectors of the input transistors T4 and T5, i.e., the inverted output signal of the phase decision unit is set to the low level such as $-2 V_{BE}$ so that the output signal SO is set to the low level such as $-2 V_{BE}$. At this time, the MOSFET Q31 is turned on to quickly discharge the load capacitor coupled to the output terminal SO, because the non-inverted output signal of the phase decision unit is set to the high level such as $-2 V_{BE}$.

If, on the other hand, both the input signals SI1 and SI2 are set to the low level such as $-2 V_{BE}$, both the MOSFETs Q29 and Q30 are turned off, but the MOSFETs Q7 and Q8 are turned on. As a result, the inverted output signal of the phase decision unit is set to the high level such as the ground potential of the circuit, and the output signal SO is set to the high level such as $-V_{BE}$. At this time, the non-inverted output signal is set to the low level such as $-3 V_{BE}$ so that the MOSFET Q31 is turned off to interrupt the discharging operation of the load capacitor.

In other words, the output signal SO is selectively set to the low level, when either the input signal SI1 or SI2 is set to the high level, so that the Bi-CMOS logic circuit of this embodiment functions as the so-called "2-input NOR gate circuit".

Figure 16:
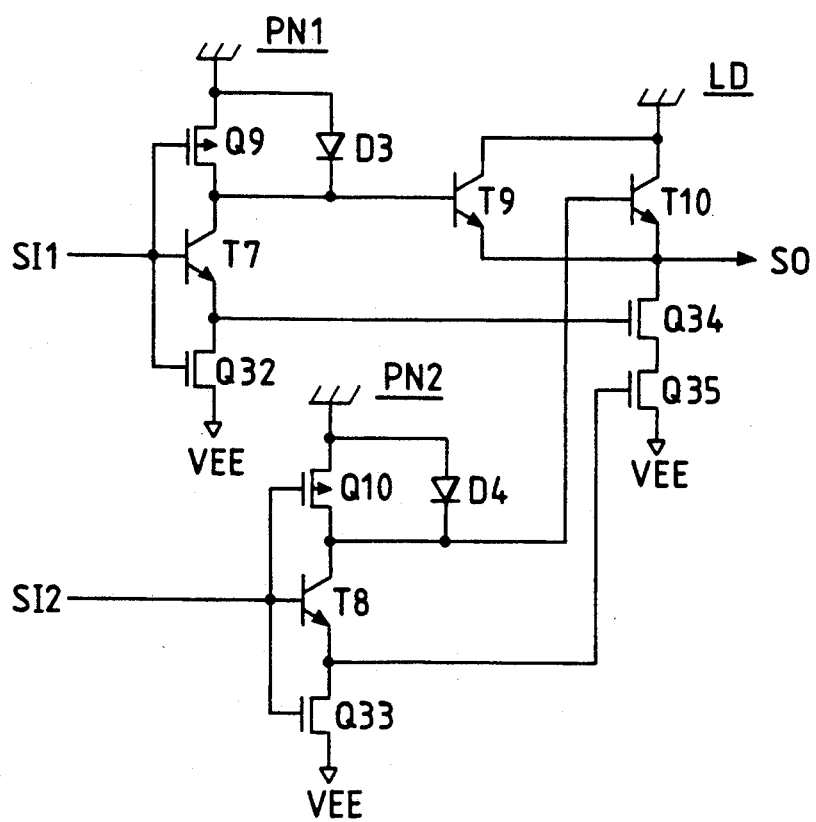
FIG. 16 is a circuit diagram showing an eleventh embodiment of the Bi-CMOS logic circuit according to the present invention.

FIG. 16 is a circuit diagram showing an eleventh embodiment of the Bi-CMOS logic circuit according to the present invention.

In FIG. 16, the Bi-CMOS logic circuit of this embodiment is constructed of: a first phase decision unit PN1 composed of an input transistor T7, a P-channel MOSFET Q9, an N-channel MOSFET Q32 and a diode D3 (or level setting means); and a second phase decision unit PN2 composed of an input transistor T8, a P-channel MOSFET Q10, an N-channel MOSFET Q33 and a diode D4 (or level setting means), although not especially limited thereto. The Bi-CMOS logic circuit further includes a load drive unit LD composed of two output transistors T9 and T10 connected in parallel between the ground potential of the circuit and the output terminal SO, and two N-channel MOSFETs Q34 and Q35 connected in series between the aforementioned output terminal SO and the supply voltage VEE.

Here, the MOSFETs Q9 and Q10 and the MOSFETs Q32 and Q33 are designed to have a threshold voltage corresponding to the base-emitter voltage $V_{BE}$ of the bipolar transistor, and the MOSFETs Q34 and Q35 are designed to have a threshold voltage corresponding to one half of the former.

The output transistor T9 has its base fed with the inverted output signal of the phase decision unit PN1, and the output transistor T10 has its base fed with the inverted output signal of the phase decision unit PN2. Moreover, the MOSFET Q34 has its gate fed with the non-inverted output signal of the phase decision unit PN1, and the MOSFET Q35 has its gate fed with the non-inverted output signal of the phase decision unit PN2. The potential of the commonly coupled emitters of the output transistors T9 and T10, i.e., the drain of the MOSFET Q34, is fed as the output signal SO of the Bi-CMOS logic circuit to the not-shown post-stage circuit of the high speed logic integrated circuit device.

When either the input signal SI1 or SI2 is set to the low level such as $-2 V_{BE}$, in the Bi-CMOS logic circuit, the inverted output signal of the corresponding phase decision unit is set to the high level such as the ground potential, and the non-inverted output signal is set to the low level such as $-3 V_{BE}$. In the load drive unit LD, therefore, either the pull-down MOSFET Q34 or Q35 is turned off so that the output signal SO is set to the high level such as $-V_{BE}$.

If, on the other hand, both the input signals SI1 and SI2 are set to the high level such as $-V_{BE}$, both the inverted output signals of the phase decision units PN1 and PN2 are set to the low level such as $-V_{BE}$, and both the non-inverted output signals are set to the high level such as $-2 V_{BE}$. As a result, the output signal SO of the Bi-CMOS logic circuit is set to the low level such as $-2 V_{BE}$. At this time, both the MOSFETs Q34 and Q35 are turned on to quickly discharge the load capacitor coupled to the output terminal SO.

In short, the output signal SO is selectively set to the low level, when both the input signals SI1 and SI2 are set to the high level, so that the Bi-CMOS logic circuit of this embodiment functions as the so-called "2-input NAND gate circuit".

Figure 17:
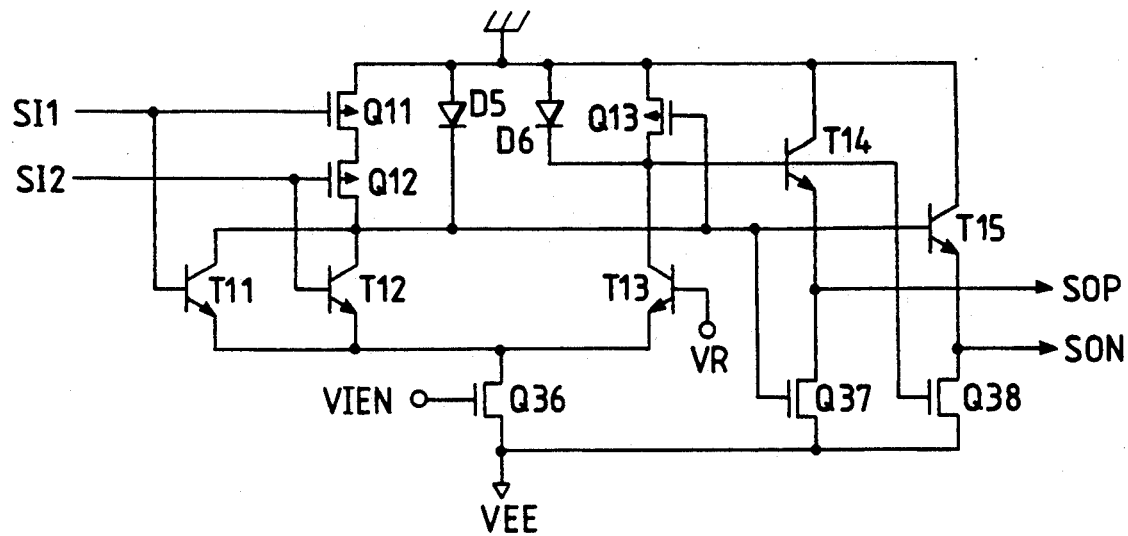
FIG. 17 is a circuit diagram showing a twelfth embodiment of the Bi-CMOS logic circuit according to the present invention.

FIG. 17 is a circuit diagram showing a twelfth embodiment of the Bi-CMOS logic circuit according to the present invention.

In FIG. 17, the Bi-CMOS logic circuit of this embodiment includes two input transistors T11 and T12 connected in parallel, and a transistor T13 connected in a differential mode with those input transistors, although not especially limited thereto.

The commonly coupled collectors of the input transistors T11 and T12 are coupled to the ground potential of the circuit through two P-channel MOSFET Q11 and Q12 connected in series. Moreover, the commonly coupled emitters of the input transistors T11 and T12 and the transistor T13 are coupled to the supply voltage VEE through an N-channel MOSFET Q36. The transistor T13 has its collector coupled to the ground potential of the circuit through a P-channel MOSFET Q13 and its base fed with a predetermined reference potential VR from the constant voltage generator of the high speed logic integrated circuit device. The base of the input transistor T11 and the gate of the MOSFET Q11 are commonly fed with the input signal SI1, and the base of the input transistor T12 and the gate of the MOSFET Q12 are commonly fed with the input signal SI2. On the other hand, the gate of the MOSFET Q36 is fed with the predetermined constant voltage VIEN from the voltage generator VGN of FIG. 14(a), and the gate of the MOSFET Q13 is fed with the potential of the commonly coupled collectors of the input transistors T11 and T12, i.e., the inverted output signal of a later-described current switch circuit.

The Bi-CMOS logic circuit further includes a diode D5 (or level setting means) connected in parallel with the MOSFETs Q11 and Q12, and a diode D6 (or level setting means) connected in parallel with the MOSFET Q13. These diodes coact with the corresponding MOSFETs Q11 and Q12 or the MOSFET Q13 as variable impedance means and as clamp elements for clamping the low level of the corresponding transistors T11 and T12 or T13 at $-V_{BE}$.

From these, the input transistors T11 and T12 and the MOSFETs Q11 and Q12 are in the shape of a 2-input NOR gate circuit, and constitute, together with the transistor T13, a current switch circuit using the aforementioned reference potential VR as a logic threshold level. On the other hand, the MOSFET Q36 is steadily operative as a current source for feeding the aforementioned current switch circuit steadily with a predetermined operating current according to the aforementioned constant voltage VIEN. Incidentally, the reference potential VR is set at an intermediate level between the high level and low level of the input signals SI1 and SI2.

The potential of the commonly coupled collectors of the input transistors T11 and T12, i.e., the inverted output signal of the current switch circuit, is fed to the gate of the aforementioned MOSFET Q13 and further to the base of an output transistor T15 and the gate of an N-channel MOSFET Q37. Moreover, the collector potential of the transistor T13, i.e., the non-inverted output signal of the current switch circuit, is fed to the base of an output transistor T14 and the gate of an N-channel MOSFET Q38. Thus, the output transistor T14 and the MOSFET Q37, and the output transistor T15 and the MOSFET Q38 constitute a pair of complementarily operating load drive units, respectively.

The emitter potential of the output transistor T14 is fed as a non-inverted output signal SOP of the Bi-CMOS logic circuit to a post-stage circuit. On the other hand, the emitter potential of the output transistor T15 is fed as an inverted output signal SON of the Bi-CMOS logic circuit to the not-shown post-stage circuit of the high speed logic integrated circuit device.

When either the input signal SI1 or SI2 is at the high level higher than the reference potential VR, in the Bi-CMOS logic circuit, the non-inverted output signal of the current switch circuit is set to the high level such as the ground potential of the circuit, and the inverted output signal of the same is set to the low level such as $-V_{BE}$. As a result, the non-inverted output signal SOP is set to the high level such as $-V_{BE}$, and the inverted output signal SON is set to the low level such as $-2V_{BE}$. At this time, in the load drive unit, the MOSFET Q38 is turned on so that the load capacitor coupled to the inverted output terminal SON is quickly discharged.

When both the input signals SI1 and SI2 are set to the low level lower than the reference potential VR, on the other hand, in the Bi-CMOS logic circuit, the non-inverted output signal of the current switch circuit is set to the low level such as $-V_{BE}$, and the inverted output signal of the same is set to the high level such as the ground potential of the circuit. As a result, the non-inverted output signal SOP is set to the low level such as $-2V_{BE}$, and the inverted output signal SON is set to the high level such as $-V_{BE}$. At this time, in the load drive unit, the MOSFET Q37 is turned on so that the load capacitor coupled to the non-inverted output terminal SOP is quickly discharged.

In other words, the non-inverted output signal SOP is selectively set to the high level when either the input signal SI1 or SI2 is at the high level. The inverted output signal SON is selectively set to the low level when either the input signal SI1 or SI2 is at the high level. As a result, the Bi-CMOS logic circuit of this embodiment functions as the so-called "2-input OR gate circuit", as viewed from the non-inverted output terminal SOP, and as the so-called "2-input NOR gate circuit", as viewed from the inverted output terminal SON.

As has been described in the foregoing embodiments of FIGS. 15 to 17, the Bi-CMOS logic circuit according to the present invention is enabled to constitute the NOR gate circuit having a plurality of inputs by combining the input transistors constituting the phase decision unit and the first and second MOSFETs in the series and parallel modes, respectively. On the other hand, the NAND gate circuit having a plurality of inputs can be constituted by combining the output transistors constituting the load drive unit and the third MOSFET in the series and parallel modes, respectively. The current switch circuit can also be constituted by adding a transistor in a differential mode to the input transistors in the parallel mode, and the OR gate can also be constituted by adding a pair of load drive units for transmitting the non-inverted and inverted output signals of the current switch circuit. Although what can be constituted by the NTL circuit and SPL circuit of the prior art is the OR gate circuit or the NOR gate circuit and although what can be constituted by the Bi-CMOS logic circuit of the prior art is the NOR gate circuit or the NAND gate circuit, the Bi-CMOS logic circuit according to the present invention can constitute three kinds of basic logic circuits to make efficient the system structure of the high speed logic integrated circuit device and accordingly a high speed computer.

Figure 18:
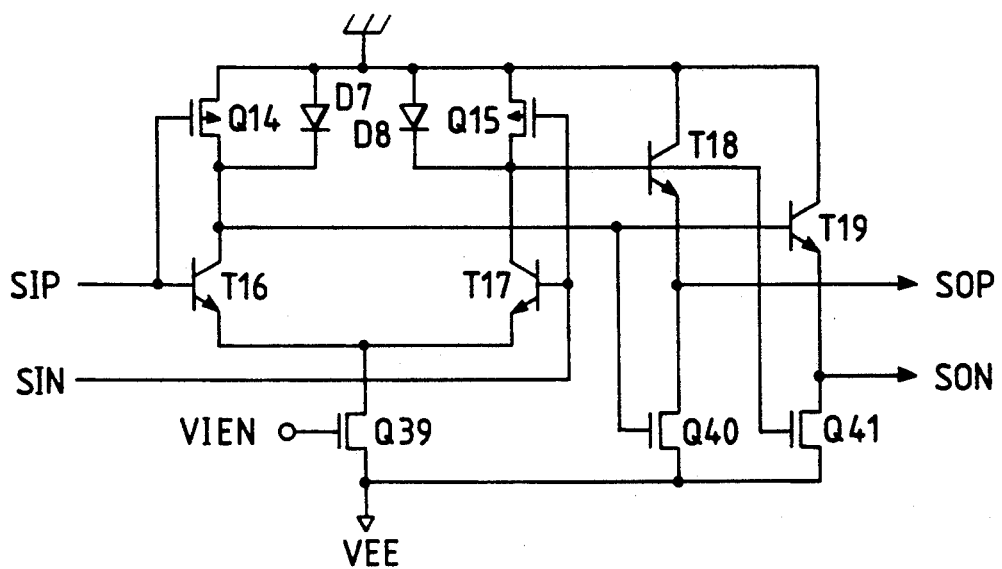
FIG. 18 is a circuit diagram showing a thirteenth embodiment of the Bi-CMOS logic circuit according to the present invention.

FIG. 18 is a circuit diagram showing a thirteenth embodiment of the Bi-CMOS logic circuit according to the present invention.

In FIG. 18, the Bi-CMOS logic circuit of this embodiment includes a pair of input transistors T16 and T17 in a differential mode. These input transistors have their collectors coupled to the ground potential of the circuit through corresponding P-channel MOSFETs Q14 and Q15 and their commonly coupled emitters coupled to the supply voltage VEE through an N-channel MOSFET Q39. The Bi-CMOS logic circuit further includes diodes D7 and D8 (or level setting means) individually connected in parallel with the MOSFETs Q14 and Q15.

The base of the input transistor T16 and the gate of the MOSFET Q14 are commonly fed with a non-inverted input signal SIP, and the base of the input transistor T17 and the gate of the MOSFET Q15 are commonly fed with an inverted input signal SIN. Moreover, the gate of the MOSFET Q39 is fed with the predetermined constant voltage VIEN from the voltage generator VGN of FIG. 14(a). As a result, the MOSFETs Q14 and Q15 coact with the corresponding diode D7 or D8 as the variable impedance means, and MOSFET Q39 acts as the current source. Moreover, those input transistors T16 and T17 and MOSFETs Q14, Q15 and Q39 act as one current switch circuit to constitute a pair of phase decision units in the differential mode.

The collector potential of the input transistor T17, i.e., the non-inverted output signal of the current switch circuit is transmitted to one load drive unit composed of an output transistor T18 and an N-channel MOSFET Q40 and further as the non-inverted output signal SOP of the Bi-CMOS logic circuit to a post-stage circuit. Likewise, the collector potential of the input transistor T16, i.e., the inverted output signal of the current switch circuit is transmitted to the other load drive unit composed of an output transistor T19 and an N-channel MOSFET Q41 and further as the inverted output signal SON of the Bi-CMOS logic circuit to a post-stage circuit.

When the input signal SI is at the logic "1", that is, when the non-inverted input signal SIP is at the high level whereas the inverted input signal SIN is at the low level, the non-inverted output signal of the current switch circuit is set to the high level such as the ground potential of the circuit, and the inverted output signal of the same is set to the low level such as $-V_{BE}$. As a result, the non-inverted output signal SOP of the circuit is set to the high level such as $-V_{BE}$, and the inverted output signal SON of the circuit is set to the low level such as $-2V_{BE}$. At this time, the MOSFET Q41 is turned on to quickly discharge the load capacitor coupled to the inverted output terminal SON, because the non-inverted output signal of the current switch circuit is set to the high level.

When, on the other hand, the input signal SI is at the logic "0", that is, the non-inverted input signal SIP is at the low level whereas the inverted input signal SIN is at the high level, the non-inverted output signal of the current switch circuit is set to the low level such as $-V_{BE}$, and the inverted output signal of the same is set to the high level such as the ground potential of the circuit. As a result, the non-inverted output signal SOP is set to the low level such as $-2V_{BE}$, and the inverted output signal SON of the same is set to the high level such as $-V_{BE}$. At this time, the MOSFET Q40 is turned on to quickly discharge the load capacitor coupled to the non-inverted output terminal SOP, when the inverted output signal of the current switch circuit is set to the high level.

Thus, a complementary input/output type Bi-CMOS logic circuit capable of more stabilized logical operations can be realized by constituting the Bi-CMOS logic circuit of a pair of phase decision units in the current switch circuit mode and a pair of load drive units for transmitting the non-inverted and inverted output signals of the phase decision units.

Figure 19:
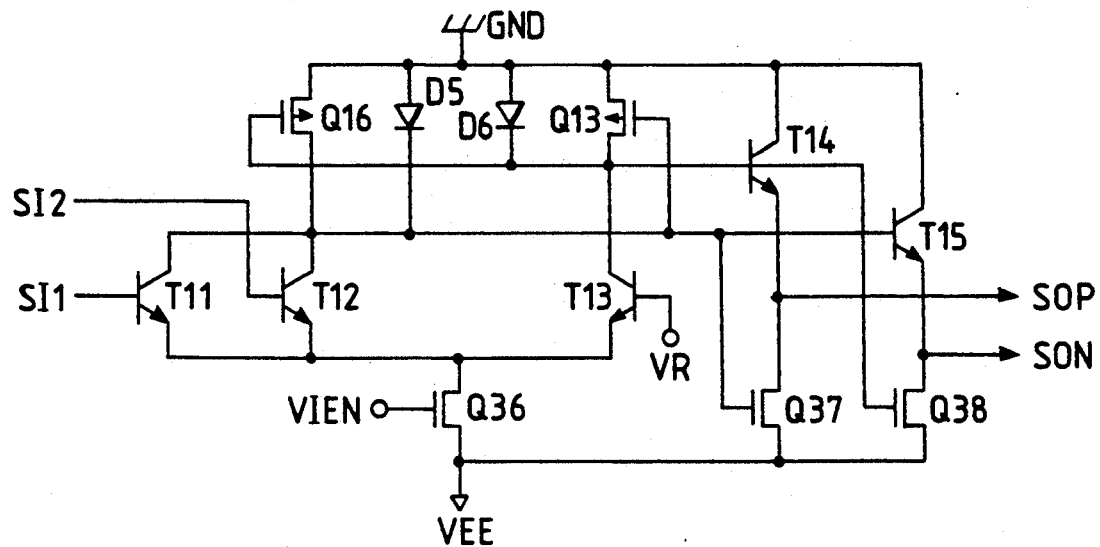
FIG. 19 is a circuit diagram showing fourteenth embodiment of the Bi-CMOS logic circuit according to the present invention.

FIG. 19, which is a fourteenth embodiment, shows a modification of the aforementioned Bi-CMOS logic circuit of FIG. 17. An additional description will be made in the following on the portions different from those of FIG. 17.

In FIG. 19, the input MOSFETs Q11 and Q12 of the embodiment of FIG. 17 are omitted and replaced by a P-channel MOSFET Q16. This MOSFET Q16 has its gate coupled to the collector of the reference bipolar transistor T13 so that it could be deemed to constitute a kind of variable impedance means together with the diode D5. Hence, the Bi-CMOS logic circuit of FIG. 19 is used as the ECL input Bi-CMOS logic circuit which is operated in response to the ECL input signals SI1 and SI2.

Figure 20:
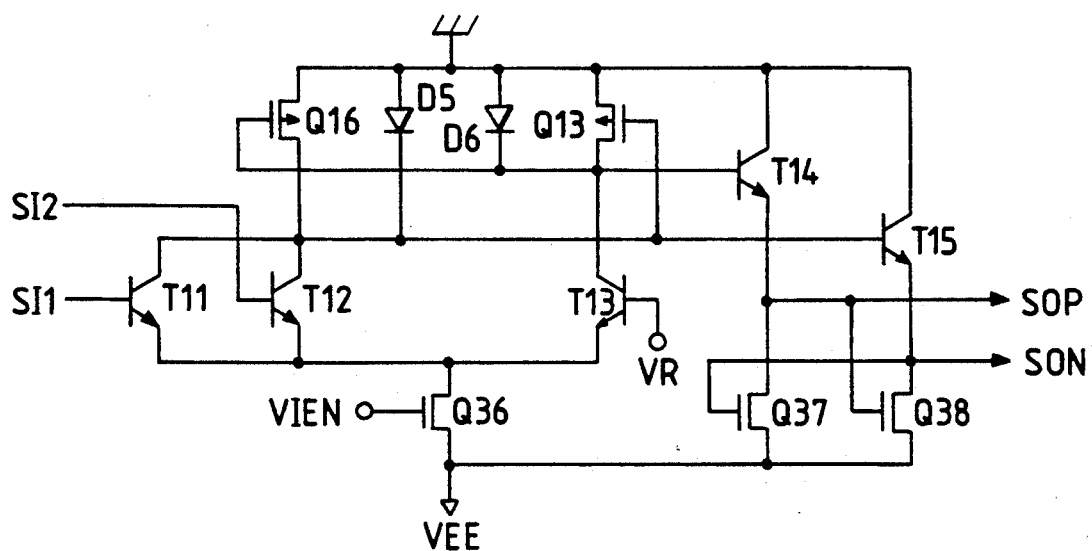
FIG. 20 is a circuit diagram showing a fifteenth embodiment of the Bi-CMOS logic circuit according to the present invention.

FIG. 20, which is a fifteenth embodiment, shows a modification of the aforementioned Bi-CMOS logic circuit of FIG. 19.

In FIG. 20, the gates of the N-channel MOSFETs Q37 and Q38 are respectively coupled to the emitters of the output bipolar transistors T15 and T14. As a result, the output transistor T14 and the MOSFET Q37, and the output transistor T15 and the MOSFET Q38 individually constitute a pair of complementarily operating load drive units.

Figure 21:
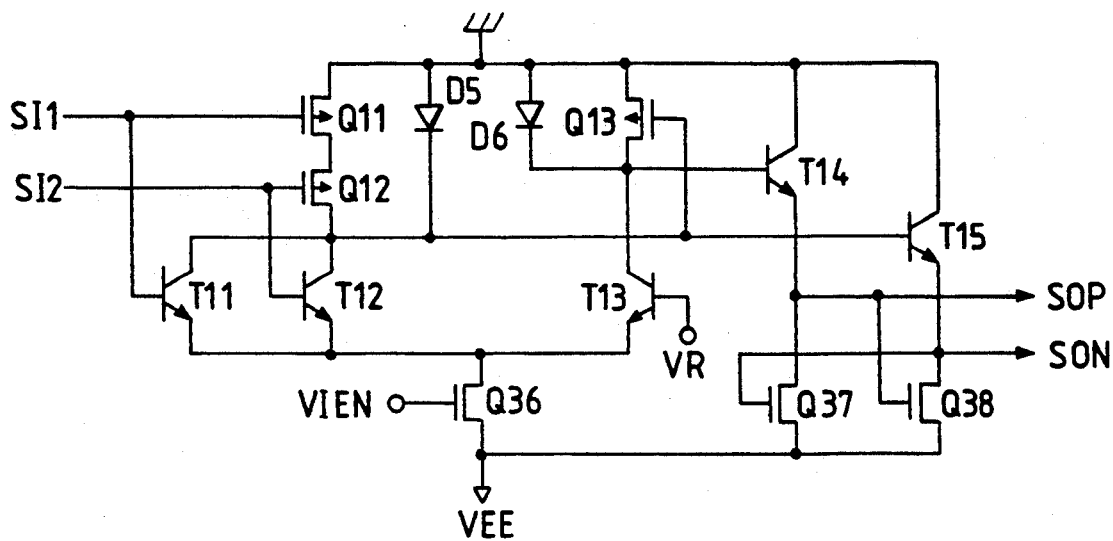
FIG. 21 is a circuit diagram showing a sixteenth embodiment of the Bi-CMOS logic circuit according to the present invention.

FIGS. 21 shows a modification, as a sixteenth embodiment, in which the gates of the output MOSFETs Q37 and Q38 of the Bi-CMOS logic circuit of FIG. 17 are respectively coupled to the emitters of the output transistors T15 and T14 so as to achieve effects similar to those of FIG. 20.

Figure 22:
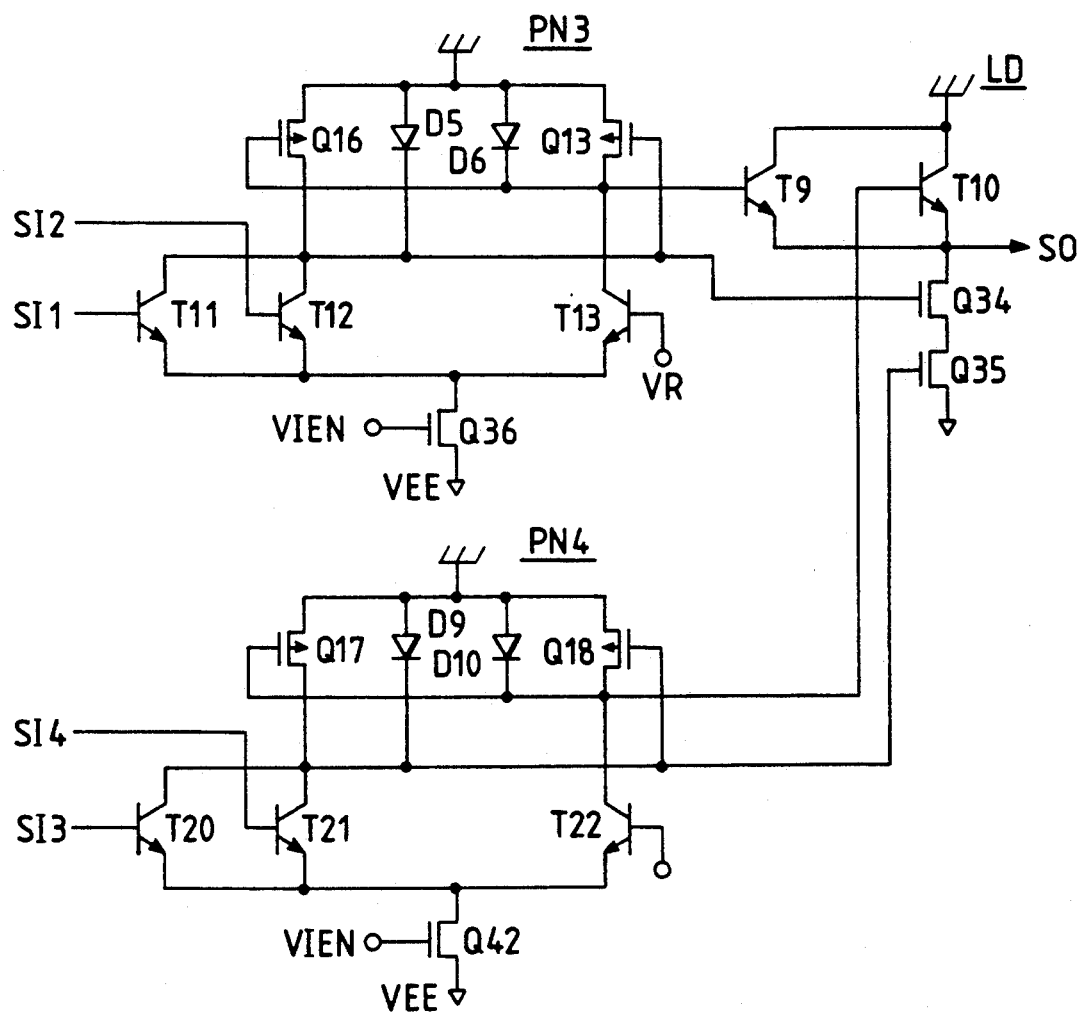
FIG. 22 is a circuit diagram showing a seventeenth embodiment of the Bi-CMOS logic circuit according to the present invention.

FIG. 22 shows a modification, as a seventeenth embodiment, in which the phase decision unit PN1 of the Bi-CMOS logic circuit of FIG. 16 is replaced by an input stage circuit PN3 composed of the transistors T11 to T13, the MOSFETs Q16, Q13 and Q36 and the diodes D5 and D6 of FIG. 19, and in which the phase decision unit PN2 is replaced by an input stage circuit PN4 composed of similar transistors T20 to T2, MOSFETs Q17, Q18 and Q42, and diodes D9 and D10.

Moreover, FIGS. 23(a) shows a further modification, as an eighteenth embodiment, of the Bi-CMOS logic circuit of FIG. 19.

In FIG. 23(a): the diodes D5 and D6 of the embodiment of FIG. 19 are respectively replaced by P-channel MOSFETs Q19 and Q20; the output transistor T15 and the MOSFET Q38 are eliminated; and a voltage source E1 is connected between the source of the MOSFET Q37 and the supply voltage VEE. The voltage source E1 is so designed that the MOSFET Q37 may have a source potential of about −1.6 V. The aforementioned MOSFETs Q19 and Q20 have their gates fed commonly with the constant voltage VIEP from the voltage generator VGP shown in FIG. 14(b), and the MOSFET Q36 has its gate fed with the constant voltage VIEN from the voltage generator VGN shown in FIG. 14(a).

From these, in the Bi-CMOS logic circuit of FIG. 23(a), like the Bi-CMOS logic circuit of FIG. 13, the output amplitude of the output signal SO and the value of the current $i_{cs}$ fed by the MOSFET Q36 are maintained free from the influences of the dispersions of the threshold voltages of the MOSFETs Q19, Q20 and Q36 due to the process dispersion.

Incidentally, the voltage source E1 of the output stage is provided to set the high level and low level of the output signal SO to −0.8 V and −1.6 V, respectively, and to use the amplitude of the output signal SO as the ECL level. As a result, the Bi-CMOS logic circuit of FIG. 23(a) acts as the ECL input/output Bi-CMOS logic circuit for outputting the output signal SO at the ECL level, which has the high level of −0.8 V and the low level of −1.6 V, in response to the input signals SI1 and SI2 at the same ECL level. Thus, FIG. 23(a) shows an OR logic circuit for achieving one output signal in response to two input signals. On the contrary, a logic circuit shown in FIG. 23(b), as a nineteenth embodiment, can achieve an OR logic output signal and a NOR logic output signal in response to two input signals.

Figure 24A:
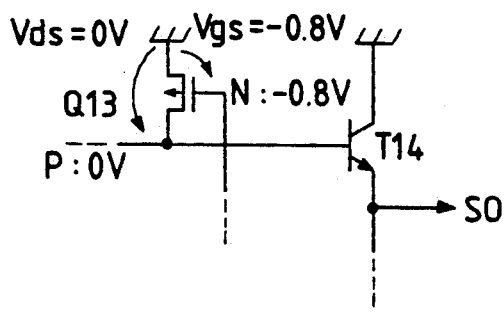
FIGS. 24(a) to 24(c) and FIGS. 25(a) to 25(c) are characteristic diagrams for explaining the operations of the Bi-CMOS logic circuits of FIGS. 23(a) and 23(b)
Figure 24B:
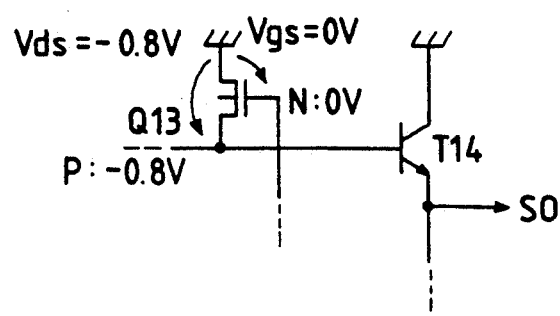
Figure 24C:
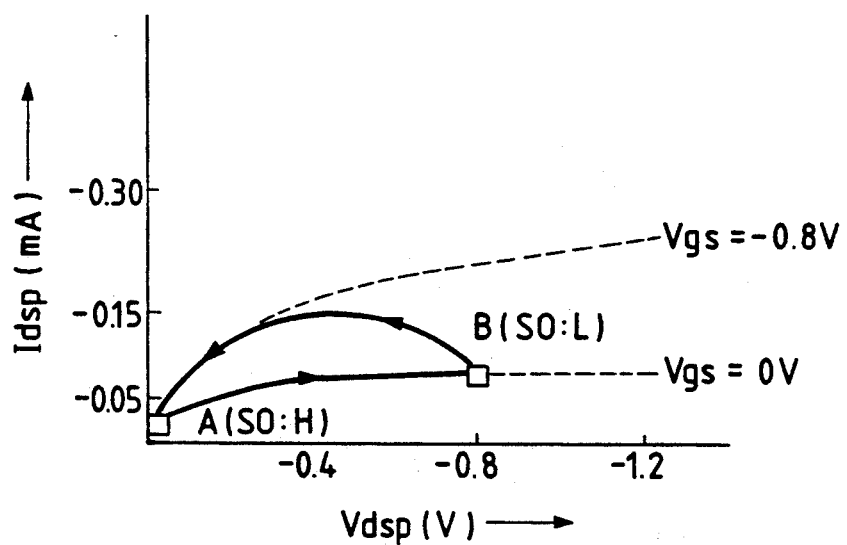

FIGS. 24 and 25 are diagrams showing the operating characteristics of the Bi-CMOS logic circuit of FIG. 23(a). Of these Figures, FIG. 24(c) plots the relationships between the drain current Idsp and the drain-source voltage Vdsp of the P-channel MOSFET Q13. FIG. 24(a) is a schematic diagram corresponding to the case, in which the gate-source voltage Vgs of the P-channel MOSFET Q13 is at −0.8 V whereas the drain-source voltage Vds is at 0 V, and to point A of FIG. 24(c). On the other hand, FIG. 24(b) is a schematic diagram corresponding to the case, in which the gate-source voltage Vgs of the P-channel MOSFET Q13 is at 0 V whereas the drain-source voltage Vds is at −0.8 V, and to point B of FIG. 24(c). The base voltage and current of the output transistor T14 change according to the arrows of FIG. 24(c).

Figure 25A:
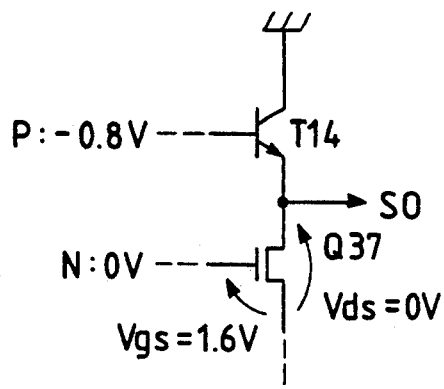
Figure 25B:
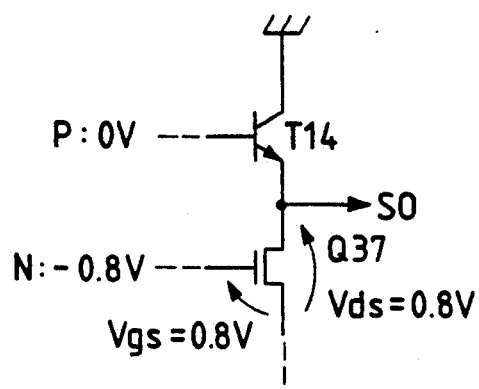
Figure 25C:
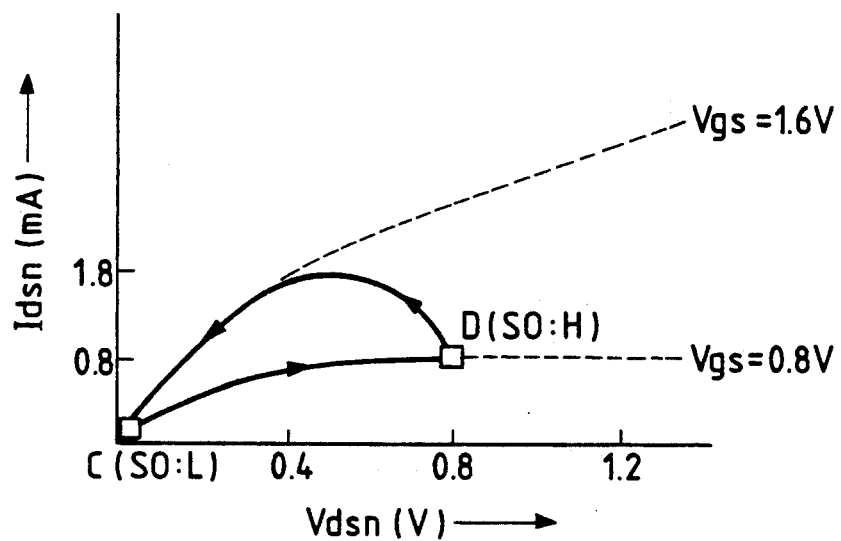

On the other hand, FIG. 25(c) plots the relationships between the drain-source voltage Vdsn and the drain current Idsn of the N-channel MOSFET Q37. FIG. 25(a) is a schematic diagram corresponding to the case, in which the gate-source voltage Vgs of the N-channel MOSFET Q37 is at 1.6 V whereas the drain-source voltage Vds is at 0 V, and to point C of FIG. 25(c). On the other hand, FIG. 25(b) is a schematic diagram corresponding to the case, in which the gate-source voltage Vgs of the N-channel MOSFET Q37 is at 0.8 V whereas the drain-source voltage Vds is at 0.8 V, and to point D of FIG. 25(c). Thus, the drain-source voltage Vds and drain-source current Idsn of the N-channel MOSFET Q37 change according to the arrows of FIG. 25(c).

As has been described in connection with the foregoing present embodiments, the following operational effects can be obtained by applying the present invention to the logic circuit such as the Bi-CMOS logic circuit which is packaged in the high speed logic integrated circuit device constituting the high speed computer:

(1) A Bi-CMOS logic circuit to be packaged in a high speed logic integrated circuit device constituting a high speed computer is basically constructed of: an input transistor coupled to receive an input signal; an output transistor having an input coupled to receive the collector potential of the input transistor; variable impedance means, connected to the collector of the input transistor, composed of a parallel arrangement of a diode and a P-channel type first MOSFET having an input coupled to receive an input signal; a current source composed of an N-channel type second MOSFET connected with the emitter of the input transistor and adapted to be selectively turned on in response to an input signal; and pull-down means composed of an N-channel type third MOSFET connected with the emitter of the output transistor and having an input coupled to receive the emitter potential of the input transistor. Thus, there is attained an effect capable of realizing a high speed bipolar logic circuit which can have a steady operating current and a reduced number of circuit elements and can correspond to a low supply voltage.

(2) Thanks to the aforementioned effect (1), there is attained an effect capable of reducing the power consumption and the chip area and enhancing the reliability of the high speed logic integrated circuit device, which is basically constructed of the Bi-CMOS logic circuit, without deteriorating the high speed operations of the circuit device.

(3) If, in the aforementioned effect (1), the aforementioned level setting means composed of the diode is replaced by a P-channel MOSFET having its gate receiving a predetermined constant voltage, and if this constant voltage is generated to compensate the fluctuations of the threshold voltage of the P-channel MOS- FET, there is attained an effect capable of arbitrarily setting the amplitude of the output signal of the Bi-CMOS logic circuit and stabilizing the operations of the same.

(4) If, in the aforementioned effect (1), the threshold voltage of the aforementioned third MOSFET is made lower than that of the aforementioned second MOSFET or if the absolute value of the supply voltage to be fed to the source of the same is made higher than that of the supply voltage to be fed to the source of the aforementioned second MOSFET, there is attained an effect capable of increasing the driving ability of the Bi-CMOS logic circuit while stabilizing the operations of the same.

(5) If, in the aforementioned effect (1), the aforementioned second or third MOSFET has its gate fed with a predetermined constant voltage capable of compensating the fluctuations of the threshold voltage of the same, there is attained an effect capable of stabilizing the operations of the Bi-CMOS logic circuit while restricting the operating current of the same.

(6) If, in the aforementioned (5), the constant voltage to be fed to the gate of the second MOSFET is fed through a fourth MOSFET which is selectively turned on in response to an input signal, there is attained an effect capable of stabilizing the operations of the Bi-CMOS logic circuit while further restricting the operating current of the same.

(7) If, in the aforementioned effects (1) to (6), the Bi-CMOS logic circuit has its phase decision unit composed of a plurality of MOSFETs connected in series, a plurality of input transistors connected in parallel and a second MOSFET, there is attained an effect capable of realizing a NOR gate circuit having a plurality of inputs and constructed of the Bi-CMOS logic circuit.

(8) If, in the aforementioned effect (7), a current switch circuit is constructed by adding a transistor having its base receiving a predetermined reference potential in a differential mode with the phase decision unit in the NOR gate circuit mode and if a load drive unit is provided for transmitting an non-inverted output of the current switch circuit, there is attained an effect capable of realizing an OR gate circuit having a plurality of inputs and constructed of the Bi-CMOS logic circuit.

(9) If, in the aforementioned effects (1) to (6), the Bi-CMOS logic circuit is equipped with a plurality of phase decision units, and if a load drive unit is provided and composed of a plurality of output transistors connected in parallel the inputs of which are coupled to receive the inverted output signals of the phase decision units, respectively, and a plurality of pull-down MOSFETs connected in series the inputs of which are coupled to receive the non-inverted output signals of the corresponding phase decision units, respectively, there is attained an effect capable of realizing an NAND gate circuit having a plurality of inputs and constructed of the Bi-CMOS logic circuit.

(10) Thanks to the aforementioned effects (7) to (9), there is attained an effect capable of realizing a plurality of kinds of Bi-CMOS logic circuits and making efficient the system structure of a high speed logic integrated circuit device constructed basically of the Bi-CMOS logic circuit and accordingly a high speed computer.

Although our invention has been specifically described in connection with the exemplified embodiments thereof, it should not be limited to the foregoing embodiments but rather is also inclusive of various modifications thereof as well as other embodiments that also fall within the scope thereof. In FIGS. 1 and 2, for example, the threshold voltages of the MOSFETs Q1 and Q21 may be lower than the base-emitter voltage of the bipolar transistor, and the threshold voltage of the MOSFET Q22 need not correspond especially to one half of the base-emitter voltage. In FIG. 3, the individual MOSFETs composing the Bi-CMOS logic circuit may be the so-called "LDD type MOSFETs" and should not be restricted by the device structure. In FIGS. 5 and 6, the absolute value of the supply voltage VEE2 may take an arbitrary value on condition that it is higher than the supply voltage VEE1. In FIG. 12, the constant voltage VIEN to be fed to the MOSFET Q22 may be fed through an N-channel MOSFET which is selectively turned on in response to the input signal SI. In FIG. 14, the specific circuit structures of the voltage generators VGN and VGP should not be restricted by the embodiment. In FIG. 15, the MOSFETs Q29 and Q30 can be replaced, for example, by one N-channel MOSFET which is made receptive of the constant voltage VIEN. In FIGS. 16 and 17, each Bi-CMOS logic circuit can be based on a similar basic circuit structure to realize a three or more input NOR gate circuit, NAND gate circuit or OR gate circuit. The features of the individual embodiments can be used in arbitrary combinations. In each embodiment, the levels and amplitudes of the input signals and output signals and the absolute values and polarities of the supply voltages can take a variety of modes of embodiments. Of the combination of those modifications, for example, the bipolar transistor can be replaced by a PNP type transistor, and the P-channel MOSFET and N-channel MOSFET can be replaced by each other.

In the description thus far made, the description has been made mainly on the case, in which our invention is applied to the Bi-CMOS logic circuit to be packaged in the high speed logic integrated circuit device constituting the high speed computer or the like or the field of application providing the background thereof. Nevertheless, the invention should not be limited thereto but can also be applied, for example, to a similar Bi-CMOS logic circuit constituting a gate array integrated circuit or a variety of special logic integrated circuit device or the like. The present invention can be widely applied to a logic circuit, which is composed of at least a bipolar transistor and a MOSFET, and to a digital integrated circuit device which is constructed basically of such logic circuit.

The effects to be obtained from the representative of the invention disclosed herein will be described in the following. Specifically, a Bi-CMOS logic circuit to be packaged in a high speed logic integrated circuit device constituting a high speed computer is basically constructed of: an input transistor made receptive of an input signal; an output transistor made receptive of the collector potential of the input transistor; variable impedance means composed of a diode connected in parallel with the collector of the input transistor and a P-channel type first MOSFET made receptive of an input signal; a current source composed of an N-channel type second MOSFET connected with the emitter of the input transistor and adapted to be selectively turned on in response to an input signal; and pull-down means composed of an N-channel type third MOSFET connected with the emitter of the output transistor and made receptive of the emitter potential of the input transistor. Thus, it is possible to provide a variety of high speed bipolar logic circuits which can have a steady operating current and a reduced number of circuit elements and can correspond to a low supply voltage. As a result, it is possible to reduce the power consumption and the chip area and enhance the reliability of the high speed logic integrated circuit device, which is basically constructed of the Bi·CMOS logic circuit, without deteriorating the high speed operations of the circuit device. At the same time, it is possible to make efficient the system structure of the high speed logic integrated circuit device and accordingly the high speed computer.

Here will be described an embodiment, in which the logic circuit of the present invention is applied to a static random access memory (i.e., static RAM).

Figure 26:
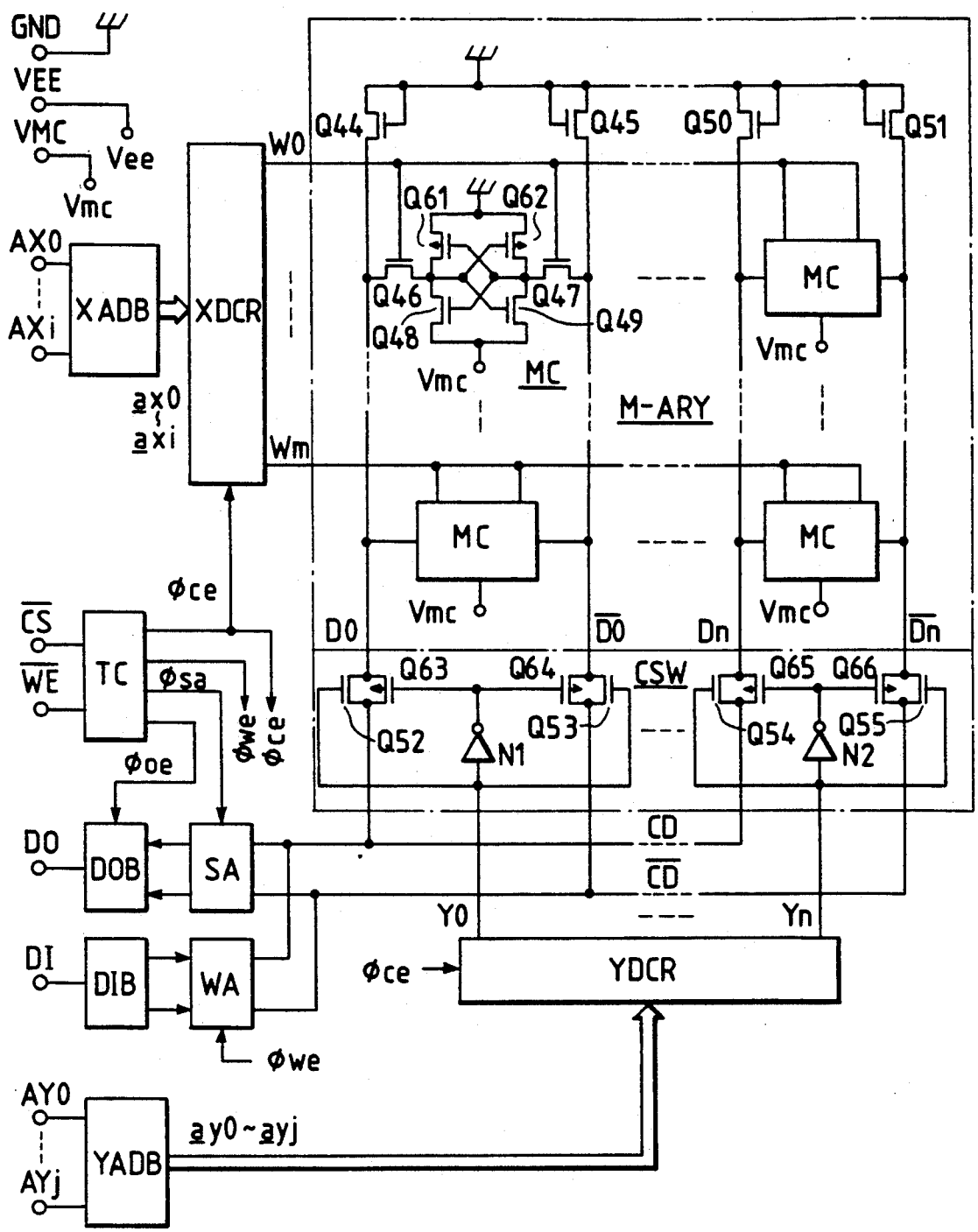
FIG. 26 is a block diagram showing a static type random access memory (i.e., SRAM) according to the present invention.

FIG. 26 is a circuit block diagram showing one embodiment of a bipolar·CMOS type static RAM according to the present invention. The circuit elements composing the individual blocks of the same Figure are formed over a single semiconductor substrate made of single crystal silicon, by the well-known bipolar·CMOS integrated circuit manufacturing technology, although not especially limited thereto. In the following Figures, the MOSFETs having their channel (or back gate) portions indicated by arrows belong to the P-channel type so that they are discriminated from the N-channel MOSFETs having no arrow attached thereto. Moreover, all the bipolar transistors, as shown, belong to the NPN type transistors.

The bipolar·CMOS type RAM of this embodiment has its memory array composed of memory cells of MOSFETs so that the circuit has its degree of integration increased and its power consumption reduced. Moreover, the bipolar·CMOS type RAM has its peripheral circuit composed of bipolar transistors and CMOSes, and especially a row selector including an X-address buffer XADB and an X-address decoder XDCR is constructed basically of the logic circuit according to the present invention so that the operations are speeded up. The bipolar·CMOS type RAM of this embodiment is fed with the ground potential (i.e., first supply voltage) of the circuit through an external terminal GND and further with a negative supply voltage Vee (i.e., second supply voltage) such as $-2.4$ V through the external terminal VEE. Another negative supply voltage Vmc (i.e., third supply voltage) such as $-2.2$ V is fed through an external terminal VMC. As will be described hereinafter, the supply voltage Vee is fed together with the ground potential of the circuit as the operating power supply of the memory peripheral circuit such as a row selector circuit. Moreover, the supply voltage Vmc is fed together with the ground potential of the circuit as the operating power supply of the memory cells composing a memory array M-ARY. As a result, the unselected level of word lines composing the memory array M-ARY is set to a relatively low absolute value such as about $-1.6$ V.

In FIG. 26, the memory array M-ARY is composed of: (m+1) word lines W0 to Wm arranged in the horizontal direction of the same Figure; (n+1) groups of complementary data lines D0·$\overline{D0}$ to Dn·Dn; and (m+1)×(n+1) static type memory cells MC arranged at the nodes of those word lines and complementary data lines.

Each memory cell MC is basically constructed, as exemplified in FIG. 26, of a latch, in which there are crossly connected two CMOS inverter circuit composed of a P-channel MOSFET Q61 and an N-channel MOSFET Q48, and a P-channel MOSFET Q62 and an N-channel MOSFET Q49, respectively. The MOSFETs Q61 and Q62 have their sources coupled to the ground potential of the circuit, and the MOSFETs Q48 and Q49 have their sources coupled to the supply voltage Vmc of the circuit. This supply voltage Vmc is used as the negative supply voltage of $-2.2$ V, as has been described hereinbefore. The commonly coupled drains of the MOSFETs Q61 and Q48 are used as the non-inverted input/output node of the aforementioned latch. On the other hand, the commonly coupled drains of the MOSFETs Q62 and Q49 are used as the inverted input/output node of the aforementioned latch.

The non-inverted input/output node of the latch of each memory cell MC is coupled through an N-channel type transmission gate MOSFET Q46 to the non-inverted signal line D0 or the like of the corresponding complementary data line. Likewise, the inverted input/output node of the latch of each memory cell MC is coupled through an N-channel type transmission gate MOSFET Q47 to the inverted signal line $\overline{D0}$ or the like of the corresponding complementary data line. These transmission gate MOSFETs Q46 and Q47 have their gates coupled commonly to the corresponding word line W0 or the like.

As will be described hereinafter, the levels of the word lines W0 to Wm are set to $-1.6$ V, for example, when unselected, and to $-0.8$ V, for example, when selected, although not especially limited thereto. Moreover, the transmission gate MOSFETs Q46 and Q47 provided to correspond to each memory cell MC are so designed to have a threshold voltage of 1.0 V, for example, that the logic threshold level corresponding to the word line level may be at $-1.2$ V.

When the corresponding word lines W0 to Wm are at the unselected level such as $-1.6$ V, both the transmission gate MOSFETs Q46 and Q47 of each memory cell MC are turned off. At this time, no current change will occur on the non-inverted signal lines and inverted signal lines of the complementary data lines D0·$\overline{D0}$ to Dn·$\overline{Dn}$. When, on the contrary, the corresponding word lines W0 to Wm are at the selected level such as $-0.8$ V, the transmission gate MOSFET Q46 or Q47 corresponding to the input/output node at the low level of each memory cell MC is selectively turned on. As a result, the two signal lines of the complementary data lines D0·$\overline{D0}$ to Dn·$\overline{Dn}$ to be selectively coupled to a later-described sense amplifier SA establish a predetermined read current difference according to the data which are held in the memory cell MC arranged at a column address coupled to and designated by the selected word line.

The word lines W0 to Wm composing the memory array M-ARY are coupled to the X-address decoder XDCR so that they are selectively brought into the selected state.

The X-address decoder XDCR includes (m+1) word line drive circuits which are provided to correspond to the word lines W0 to Wm, as will be described hereinafter. These word line drive circuits function as NOR gate circuits having (i+2) inputs. The X-address decoder XDCR has its individual word line drive circuits fed with a predetermined combination of complementary internal address signals ax0 to axi (wherein a complementary internal address signal ax0 will express both a non-inverted internal address signal $\overline{ax0}$ and an inverted internal address signal ax0, for example) at the ECL level, which are fed from the X-address buffer XADB. The X-address decoder XDCR is further fed with a timing signal $\phi$ce from a later-described timing control circuit TC. The X-address decoder XDCR decodes the aforementioned complementary internal address signals ax0 to axi in synchronism with the aforementioned timing signal $\phi$ce to set one word line, which is designated by X-address signals AX0 to AXi, selectively to the aforementioned selection level.

The X-address buffer XADB includes a plurality of unit X-address buffers which are provided to correspond to external terminals AX0 to AXi, as will be described hereinafter. The X-address buffer XADB discriminates the levels of the X-address signals AX0 to AXi, which are fed at the ECL level through the external terminals AX0 to AXi, in accordance with a predetermined reference potential to produce the aforementioned complementary internal address signals ax0 to axi.

The specific circuit structures and operations of the X-address decoder XDCR and the X-address buffer XADB will be described in detail hereinafter.

On the other hand, the complementary data lines $D0 \cdot \overline{D0}$ to $Dn \cdot \overline{Dn}$ composing the memory array M-ARY are coupled, on one side, to the ground potential of the circuit through corresponding load MOSFETs Q44·Q45 to Q50·Q51. These load MOSFETs have their gates and drains commonly coupled to have a diode mode.

The complementary data lines $D0 \cdot \overline{D0}$ to $Dn \cdot \overline{Dn}$ composing the memory array M-ARY are selectively connected, on the other hand, with complementary common data lines $CD \cdot \overline{CD}$ through two groups of corresponding switch MOSFETs Q63·Q52 and Q64·Q53 to Q65·Q54 and Q66·Q55 of a column switch CSW. Of these, the inner two P-channel MOSFETs Q63·Q64 and Q65·Q66 have their gates commonly coupled and further to the output terminals of corresponding inverter circuits N1 and N2. On the other hand, the outer two N-channel MOSFETs Q52·Q53 and Q54·Q55 likewise have their gates commonly coupled and further to the input terminals of the aforementioned corresponding inverter circuits N1 and N2. These inverter circuits N1 and N2 have their input terminals individually fed with corresponding data line selecting signals Y0 to Yn from a Y-address decoder YDCR. These data line selecting signals Y0 to Yn are set, when unselected, to the low level such as the supply voltage Vee of the circuit, and, when selected, to the high level such as the ground potential of the circuit, although not especially limited thereto.

The switch MOSFETs Q63·Q52 and Q64·Q53 to Q65·Q54 and Q66·Q55 of the column switch CSW are simultaneously turned on, when the corresponding data line selecting signals Y0 to Yn are at the high level, to connect the corresponding complementary data lines $D0 \cdot \overline{D0}$ to $Dn \cdot \overline{Dn}$ and the complementary common data lines $CD \cdot \overline{CD}$ selectively.

The Y-address decoder YDCR is constructed basically of a bipolar-CMOS composite gate circuit, although not especially limited thereto. The Y-address decoder YDCR is fed with complementary internal address signals ay0 to ayj from a Y-address buffer YADB and with the aforementioned timing signal $\phi$ce from the timing control circuit TC. The complementary internal address signals ay0 to ayj are used as internal signals at the CMOS level, although not especially limited thereto. The Y-address decoder YDCR is selectively brought into the operating state in response to the timing signal $\phi$ce. In this operating state, the Y-address decoder YDCR decodes the complementary internal address signals ay0 to ayj to set the aforementioned data line selecting signals Y0 to Yn selectively.

The Y-address buffer YADB includes a plurality of unit Y-address buffers which are provided to correspond to external terminals AY0 to AYj, although not especially limited thereto. The Y-address buffer YADB decides the levels of the Y-address signals AY0 to AYj, which are fed at the ECL level through the external terminals AY0 to AYj, in accordance with a predetermined reference voltage to produce the aforementioned complementary internal address signals ay0 to ayj.

To the complementary common data lines $CD \cdot \overline{CD}$, there are coupled not only a pair of input terminals of a sense amplifier SA but also a pair of output terminals of write amplifier WA. The sense amplifier SA is fed with a timing signal $\phi$sa from the timing control circuit TC. The output terminal of the sense amplifier SA is further coupled to the input terminal of a data output buffer DOB. This data output buffer DOB is fed with a timing signal $\phi$oe from the timing control circuit TC. The output terminal of the data output buffer DOB is coupled to a data output terminal D0. On the other hand, the write amplifier WA is fed with a timing signal $\phi$we from the timing control circuit TC. The input terminal of the write amplifier WA is further coupled to the output terminal of a data input buffer DIB. The input terminal of the data input buffer DIB is coupled to a data input terminal DI.

The sense amplifier SA is constructed of a current sense type bipolar differential amplifier and is selectively brought into an operating state when the aforementioned timing signal $\phi$sa is at the high level. In this operating state, the sense amplifier SA amplifies the read currents, which are transmitted from the selected memory cells MC through the complementary common data lines $CD \cdot \overline{CD}$, to feed complementary read signals at the logic level. These complementary read signals are transmitted to the data output buffer DOB.

In the reading mode of the bipolar-CMOS type RAM, the data output buffer DOB is selectively brought into an operating state in response to the timing signal $\phi$oe fed from the timing control circuit TC. In this operating state, the data output buffer DOB converts the logic level of the complementary read signal, which is outputted from the sense amplifier SA, into the ECL level and feeds it from the data output terminal D0 to an external device through an output transistor having an open emitter. When the timing signal $\phi$oe is at the low level, the output of the data output buffer DOB is in a high impedance state.

In the writing mode of the bipolar-CMOS type RAM, on the other hand, the data input buffer DIB converts the ECL level of the write data, which are fed from the outside through the data input terminal DI, into the MOS level of the complementary write signal and transmits it to the write amplifier WA.

This write amplifier WA is selectively brought into an operating state when the timing signal $\phi$we is at the high level. In this operating state, the write amplifier WA feeds the complementary common data lines $CD \cdot \overline{CD}$ with the write current according to the complementary write signal which is fed through the data input buffer DIB.

The timing control circuit TC produces and feeds the aforementioned various timing signals to the individual circuits on the basis of a chip selecting signal $\overline{CS}$ and a write enable signal $\overline{WE}$, which are fed as control signals from the outside.

Figure 27:
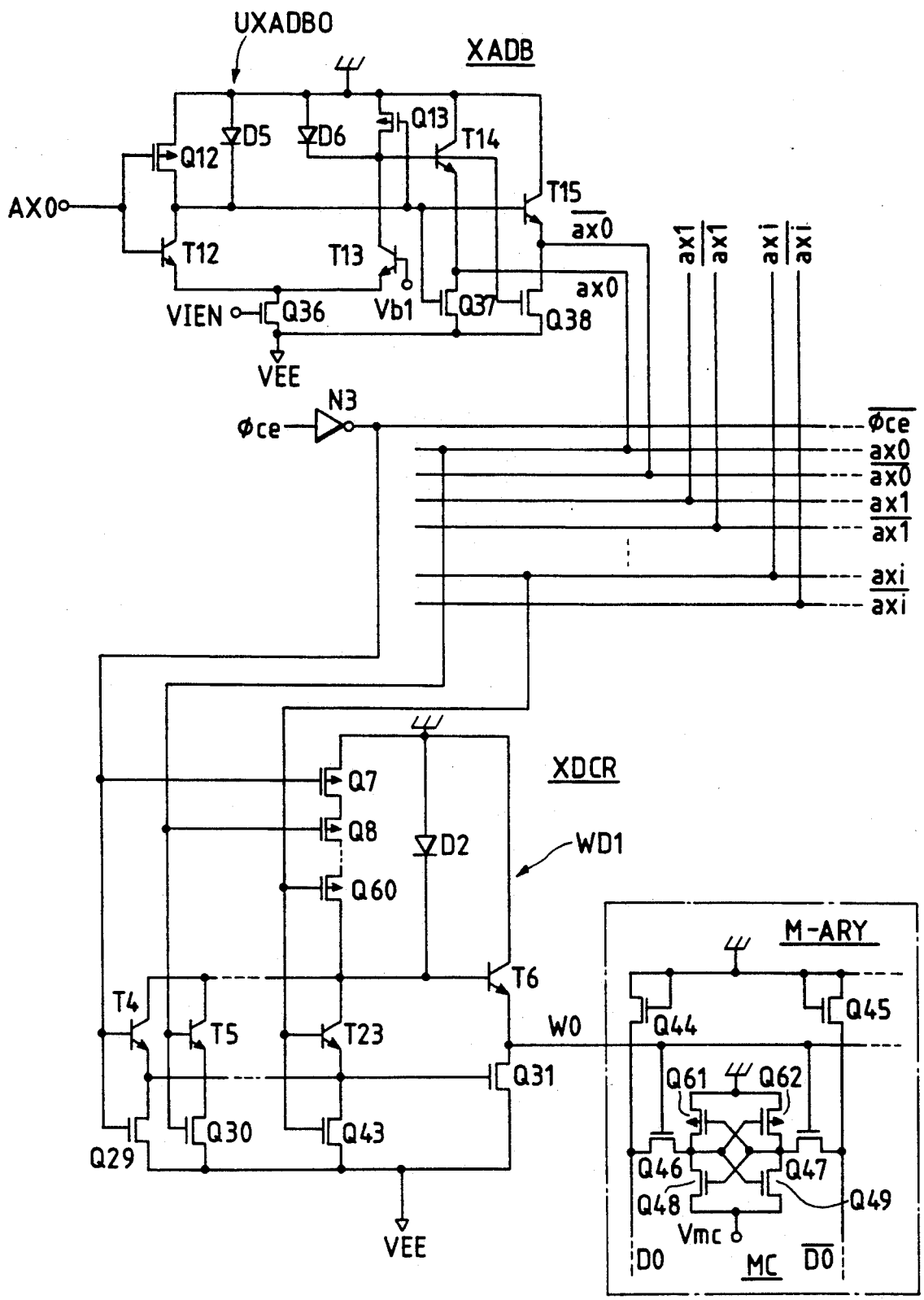
FIG. 27 is a detailed circuit diagram showing an SRAM including a Bi-CMOS logic circuit of the present invention.

FIG. 27 is a circuit diagram showing one embodiment of the X-address buffer XADB and X-address decoder XDCR of the bipolar-CMOS type RAM of FIG. 26. In the same Figure, there are exemplified a unit address buffer UXADB0 of the X-address buffer XADB, which is provided to correspond to the X-address signal AX0, and a word line drive circuit WD1 of the X-address decoder XDCR, which is provided to correspond to the word line W0. As could be understood from the same Figure, the unit X-address buffer UXADB0 is constructed of the logic circuit which is prepared by omitting the MOSFET Q11 and the bipolar transistor T11 from the logic circuit of FIG. 17. The word line drive circuit WD1 is constructed by making use of the logic circuit of FIG. 15.

The X-address buffer XADB is equipped with an i-number of similar input buffers and current switch circuits in a manner to correspond to other X-address signals AX1 to AXi. On the other hand, the X-address decoder XDCR is equipped with an n-number of similar word line drive circuits in a manner to correspond to other word lines W1 to Wm. In the same Figure, a portion of the memory array M-ARY is shown as in FIG. 1, but the description of this overlapped portion will be omitted.

In FIG. 27, when the X-address signal AX0 is at the high level (e.g., −0.8 V) of the ECL level so that the level exceeds the aforementioned reference potential Vb1 (which corresponds to the reference potential VR of FIG. 17) at the base of the transistor T12, this transistor T12 has an increased collector current. Then, the MOSFET Q12 is substantially turned off so that most of the collector current of the transistor T12 flows through the diode D5. As a result, the collector potential of the transistor T12 is set to the low level such as the clamp voltage of the diode D2. At this time, on the contrary, the transistor T13 has its collector current decreased so that it is cut off. Since, on the other hand, the collector of the transistor T12 is coupled to the gate of the MOSFET Q13, this MOSFET Q13 is turned on in response to the low level of the collector voltage of the transistor T12. As a result, the collector voltage of the transistor T13 is substantially set to the high level such as the ground potential of the circuit so that the collector voltage of the transistor T12 takes a predetermined low level determined by the clamp voltage of the diode D5. If, on the other hand, the X-address signal AX0 is set to the low level such as −1.6 V of the ECL level so that the level is lower than the aforementioned reference potential Vb1 at the base of the transistor T12, the transistor T13 has an increased collector current. At this time, on the contrary, the transistor T12 has a decreased collector current so that it is cut off. Since, at this time, the MOSFET Q12 is ON, the collector voltage of the transistor T12 is substantially set to the high level such as the ground potential of the circuit. Since the collector of the transistor T12 is connected with the gate of the MOSFET Q13, this MOSFET Q13 is turned off so that the collector voltage of the transistor T13 takes a predetermined low level (e.g., −0.8 V) determined by the clamp voltage of the diode D6.

The collector voltages of the transistors T13 and T12 are dropped by by the base-emitter voltage of the transistors T14 and T15 composing an emitter-follower circuit and are fed as the inverted internal address signal $\overline{ax0}$ and the non-inverted internal address signal ax0 to the X-address decoder XDCR. As a result, the high level $V_{axH}$ of the non-inverted and inverted internal address signals ax0 and $\overline{ax0}$ is expressed by the following Equation, if the base-emitter voltage of the bipolar transistor is designated by $V_{BE}$:

$$V_{axH} = -V_{BE}.$$

Since, in this embodiment, the base-emitter voltage $V_{BE}$ is at 0.8 V, the high level $V_{axH}$ of the aforementioned non-inverted and inverted internal address signals ax0 and $\overline{ax0}$ takes a value of −0.8 V, although not especially limited thereto.

On the other hand, the low level $V_{axL}$ of the non-inverted and inverted internal address signals ax0 and $\overline{ax0}$ is expressed by the following Equation:

$$\begin{aligned} V_{axL} &= -V_{FD5} - V_{BE} \\ &= -V_{FD6} - V_{BE} \\ &= -V_{BE} - V_{BE} \\ &= -2V_{BE} \\ &= -1.6 \text{ (V)},\end{aligned}$$

wherein $V_{FD5}$ and $V_{FD6}$ are the individual forward voltages of the diodes D5 and D6 and are set, as follows:

$$V_{FD5} = V_{FD6} = V_{BE} = 0.8 \text{ V}.$$

As has been described hereinbefore, the X-address buffer XADB is equipped with similar unit X-address buffers corresponding to other X-address signals AX1 to AXi. These unit X-address buffers produce the complementary internal address signals ax1 to axi, which have a level similar to that of the aforementioned complementary internal address signal ax0, and feeds them to the X-address decoder XDCR.

This X-address decoder XDCR includes (m+1) word line drive circuits. These word line drive circuits WD1 include (i+2) transistors T4 to T23 connected in parallel, as exemplified in FIG. 27.

The transistor T4 has its base fed with an inverted signal, i.e., an inverted timing signal $\phi ce$, which is inverted from the aforementioned timing signal $\phi ce$ by an inverter circuit N3. This inverter circuit N3 is constructed of a bipolar current switch circuit, although not especially limited thereto, and has its output signal, i.e., the inverted timing signal $\overline{\phi ce}$ at the ECL level. The transistors T5 to T23 have their bases fed with a predetermined combination of the complementary internal address signals ax0 to axi which are generated by the aforementioned X-address buffer XADB. Specifically, the transistors T5 to T23 of the individual word line drive circuits have their bases fed with the complementary internal address signals ax0 to axi in the combination to designate the corresponding word line number in response to the inverted signal. In short, in case of the word line drive circuit WD1 of FIG. 27, the corresponding word line number is "0" so that the transistors T5 to T23 have their bases individually fed with the non-inverted internal address signals ax0 to axi.

The transistor T6 has its emitter acting as the output terminal of the word line drive circuit WD1 and coupled to the corresponding word line W0 of the memory array M-ARY.

If the inverted timing signal $\overline{\phi ce}$ or any of the non-inverted internal address signals ax0 to axi is set to the high level of the ECL level, the output of the word line drive circuit WD1 takes a predetermined low level. If, on the other hand, all the inverted timing signal $\overline{\phi ce}$ and the non-inverted internal address signals ax0 to axi are set to the low level of the ECL level, the output of the word line drive circuit WD1 takes a predetermined high level.

As a result, the word line drive circuit WD1 of the X-address decoder XDCR functions as a NOR gate circuit for the inverted timing signal $\overline{\phi ce}$ and the non-inverted internal address signals ax0 to axi, i.e., an AND gate circuit for the timing signal $\phi ce$ and the inverted internal address signals $\overline{ax0}$ to $\overline{axi}$. Hence, the output signal of the word line drive circuit WD1, i.e., the word line W0 is selectively set to the selection level at the high level in accordance with the following logic condition, and otherwise to the unselection level at the low level:

$$W0 = \overline{\overline{\phi ce} + ax0 + ax1 + \cdots + axi}$$
$$= \phi ce \cdot \overline{ax0} \cdot \overline{ax1} \cdots \overline{axi}.$$

As would be apparent from the above description, moreover, a word line potential $V_{WH}$ at the time of selecting the word lines W0 to Wm is expressed by the following Equation if the base-emitter voltage of the bipolar transistor is designated by $V_{BE}$:

$$V_{WH} = -V_{BE}.$$

On the other hand, the word line potential $V_{WL}$ when the word lines W0 to Wm are not selected is expressed by the following Equation, if the clamp voltage by the diode D2 is designated by $V_{FD2}$:

$$V_{WL} = -V_{FD2} - V_{BE} \qquad (3)$$
$$= -2V_{BE}.$$

In the bipolar-CMOS type RAM of this embodiment, as has been described hereinbefore, the supply voltage Vmc to be fed to the memory cells MC composing the memory array M-ARY is set to a voltage such as $-2.2$ V. Thus, the unselection level $V_{WL}$ of the word lines W0 to Wm has to satisfy the following Relation, if the transmission gate MOSFETs Q46 and Q47 provided to correspond to the individual memory cells MC have a threshold voltage $V_{THN}$:

$$V_{WL} \leq -Vmc + V_{THN} \qquad (4).$$

At this time, moreover, in order that the transistors T4 to T23 of the individual word line drive circuits may not be saturated, the first term of the righthand side of the foregoing Equation (3), i.e., the potential of the commonly coupled collectors of the transistors T4 to T23 has to satisfy the following Relation for the high level $V_{axH}$ of the inverted timing signal $\overline{\phi ce}$ and the non-inverted and inverted internal address signals ax0 to axi:

$$V_{axH} \leq V_{FD2} \qquad (5).$$

In this embodiment, the threshold voltage $V_{THN}$ of the transmission gate MOSFET of the memory cells MC is set to 1.0 V. As has been described hereinbefore, moreover, the base-emitter voltage $V_{BE}$ of the bipolar transistor is set to 0.8 V, and the high level $V_{axH}$ of the inverted timing signal $\overline{\phi ce}$ and the non-inverted and inverted internal address signals ax0 to axi is set to $-0.8$ V. Hence, the unselected level $V_{WL}$ of the word lines W0 to Wm may be concluded to be within the following range from the foregoing Relations (3) to (5):

$$-1.6 \ V \leq V_{WL} \leq -1.0 \ V \qquad (6).$$

Since, in this embodiment, the supply voltage Vmc to be fed to the memory cells MC is at $-2.2$ V, all the aforementioned necessary conditions are satisfied by setting the unselection level of the word lines W0 to Wm to $-1.6$ V, for example.

When the word lines W0 to Wm are at the unselected level such as $-1.6$ V, as has been described hereinbefore, the transmission gate MOSFETs Q46 and Q47 of the memory cells MC, which have their gates coupled to the corresponding word lines, have their gate-source voltages dropped to a level lower than the threshold voltage $V_{THN}$ so that they are turned off. If, on the other hand, the word lines W0 to Wm are set to the selection level such as $-0.8$ V, the transmission gate MOSFETs Q46 to Q47 of the (n+1) memory cells MC, which are coupled to the corresponding word lines, have their gate-source voltage set to a value of about 1.4 V higher than the threshold voltage so that they are selectively turned on, if their corresponding input/output nodes are at the low level. As a result, the non-inverted signal lines and inverted signal lines of the complementary data lines D0·$\overline{D0}$ to Dn·$\overline{Dn}$ to be selectively coupled to the sense amplifier SA through the complementary common data lines CD·$\overline{CD}$ establish a difference in the read current according to the hold data of the corresponding memory cells MC.

As has been described hereinbefore, the bipolar-CMOS type RAM of this embodiment has its memory array composed of MOSFETs so that the circuit has its structure highly integrated and its power consumption reduced. Since, moreover, the memory peripheral circuit is composed of bipolar transistors and CMOSes, the operations are speeded up. In the bipolar-CMOS type RAM of this embodiment, moreover, the supply voltage Vmc to be fed to the memory cells is made to have an absolute value smaller than the supply voltage Vee fed to the memory peripheral circuit or the like so that the unselection level of the word lines W0 to Wm is set to a relatively high level such as $-1.6$ V. As a result, the X-address buffer XADB and X-address decoder XDCR for determining the access time of the bipolar-CMOS type RAM can be constructed of a bipolar-CMOS circuit for handling the input/output signal at the ECL level, and the complementary internal address signals ax0 to axi are transmitted while being left unconverted into the CMOS level. As a result, the word line selecting operations by the X-address buffer XADB and the X-address decoder XDCR are speeded up so that the access time of the bipolar-CMOS type RAM is accordingly speeded up.

In FIG. 27, the unit X-address buffer UXADB0 can be constructed of the logic circuit which is prepared by eliminating the bipolar transistor T11 from the logic circuit of FIGS. 19 to 21 or FIG. 23. On the other hand, the word line drive circuit WD1 can be constructed of the logic circuit of FIG. 16 or FIG. 23 and the logic circuit which is prepared by eliminating the bipolar transistor T14 and the MOSFET Q37 from that of FIG. 17 or 19.

More preferably, if both the unit address buffer UX-ADB0 and the word line drive circuit WD1 are constructed on the basis of the logic circuit of FIG. 23 and if the constant voltages VIEN and VIEP are fed from the individual voltage generators VGN and VGP of FIG. 14 to the individual unit X-address buffer and the individual word like drive circuits, the $V_{TH}$ dispersion of the individual MOSFETs due to the process dispersion can be compensated so that the cost can be reduced by improving the yield of the semiconductor memory.

Here will be described an embodiment of the case, in which the logic circuit of the present invention is applied to a gate array.

Figure 28:
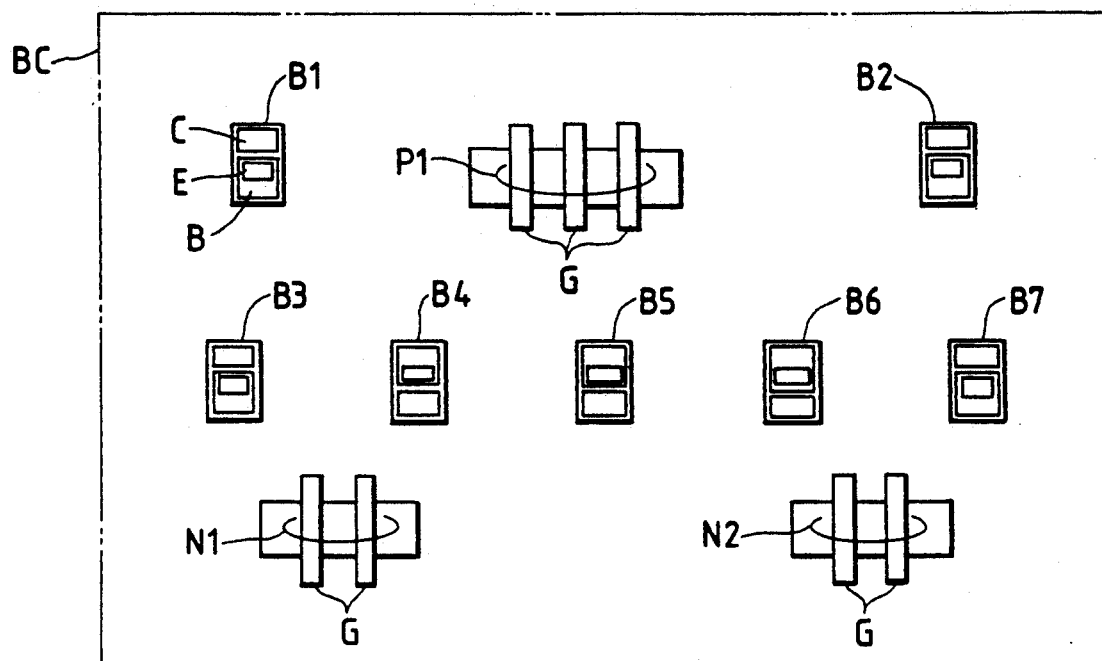
FIG. 28 is an arrangement diagram showing basic cells for a gate array capable of forming the logic circuits of FIGS. 15, 16 and 21.

FIG. 28 is a layout pattern diagram showing gate array basic cells BC capable of forming the individual logic circuits of FIGS. 15, 16 and 21. Incidentally, the basic cells are defined as the minimum units on the layout including a plurality of semiconductor elements.

As shown in FIG. 28, the basic cell BC, as defined by double-dotted lines, includes seven bipolar transistors B1 to B7, a P-channel MOSFET region P1 and N-channel MOSFET regions N1 and N2. The region P1 is formed with three gate electrodes G of poly-silicon, and the regions N1 and N2 are individually formed with two gate electrodes of poly-silicon. As a result, the region P1 is formed with three PMOSFETs, and the regions N1 and N2 are individually formed with two NMOSFETs. The NMOSFETs formed in the region N1 have their threshold value set about two times as high as that of the NMOSFETs formed in the region N2, for example.

Figure 29:
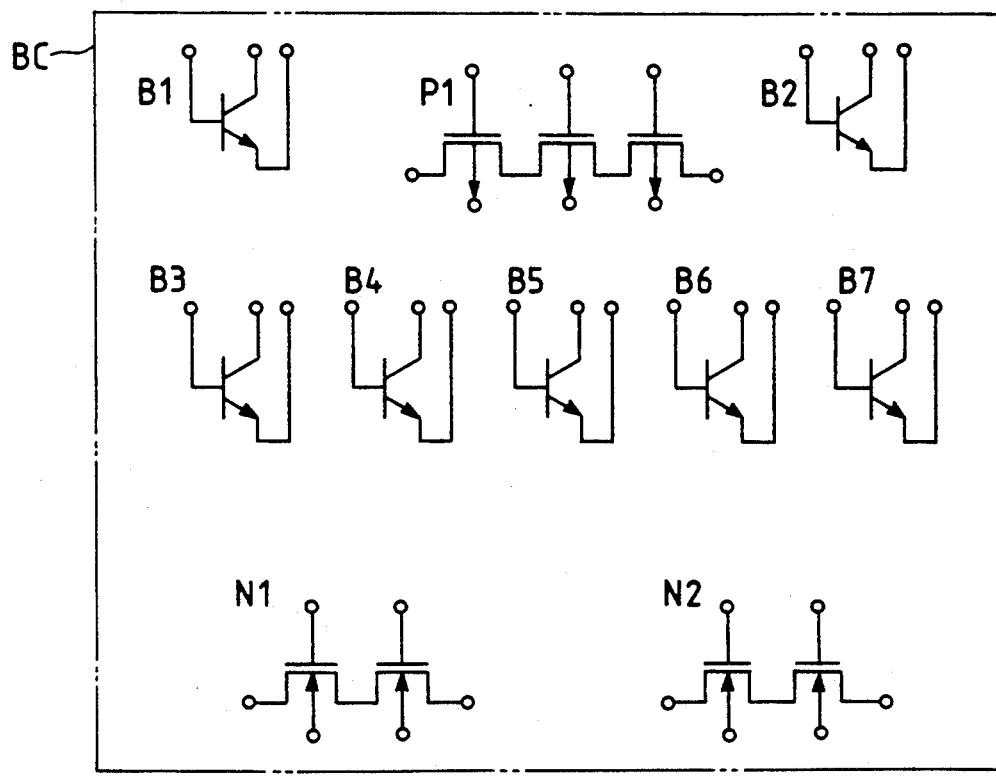
FIG. 29 is an equivalent diagram showing the basic cell BC of FIG. 28.

FIG. 29 is a schematic diagram showing the basic cell BC such that the individual semiconductor elements of the basic cell BC shown in FIG. 28 may be easily understood by using the transistor symbols.

Figure 30:
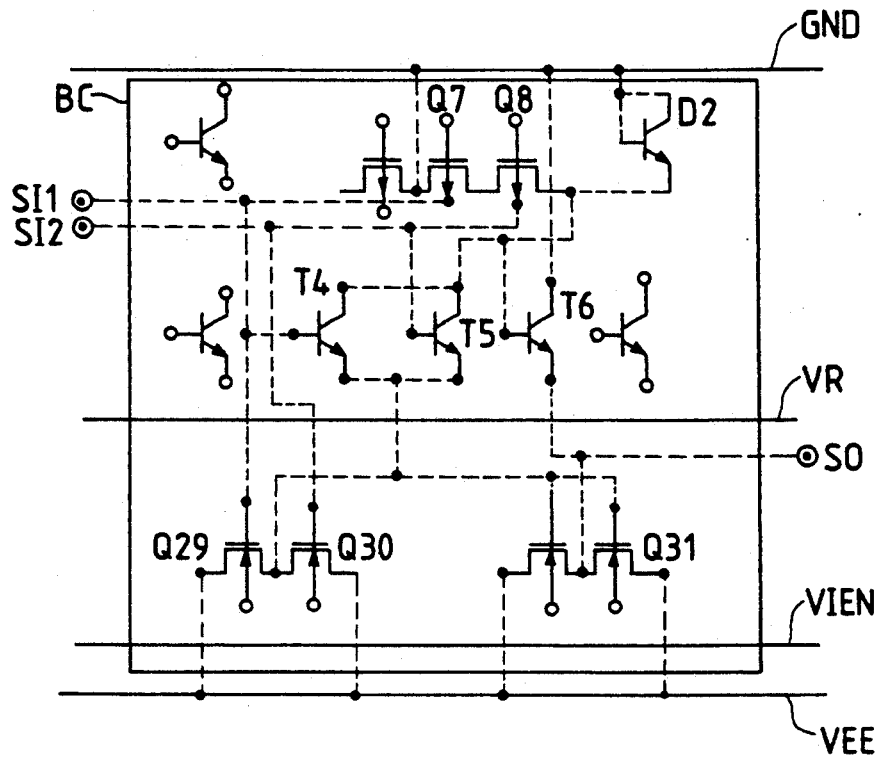
FIG. 30 is a connection diagram showing a basic cell formed with the logic circuit of FIG. 15.
Figure 31:
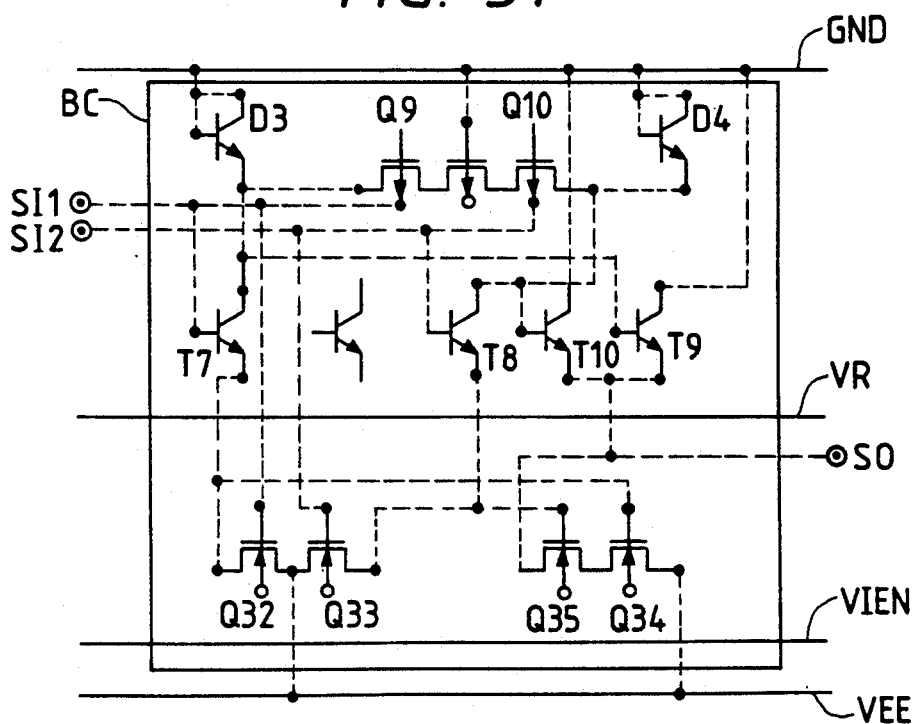
FIG. 31 is a connection diagram showing a basic cell formed with the logic circuit of FIG. 16.
Figure 32:
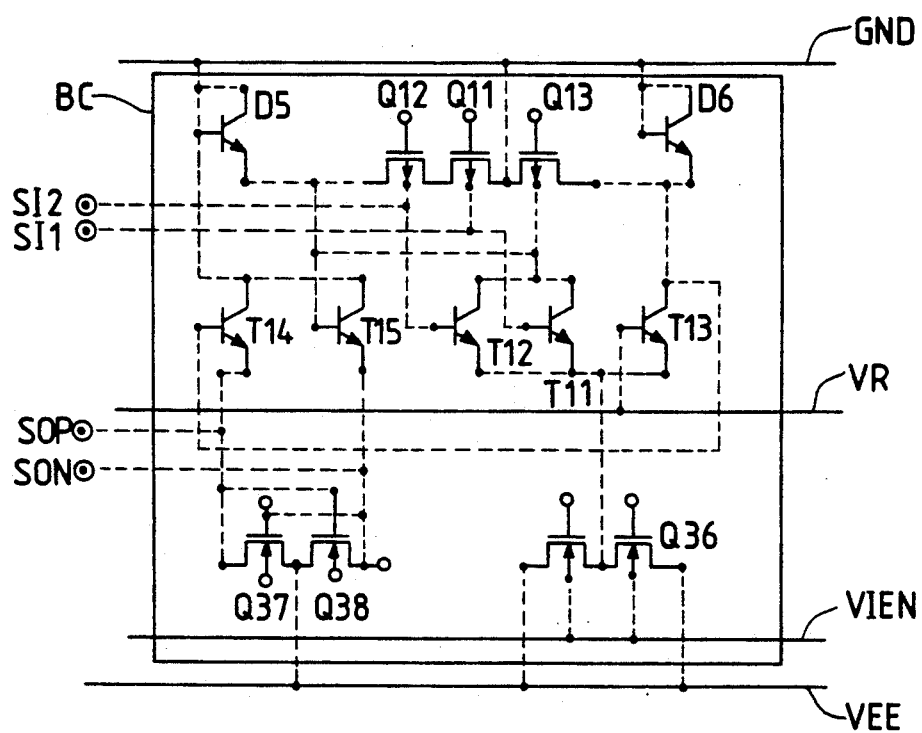
FIG. 32 is a connection diagram showing a basic cell formed with the logic circuit of FIG. 21.

FIG. 30 shows a connection state in broken lines in case the logic circuit of FIG. 15 is realized in the basic cell BC; FIG. 31 shows a connection state in broken lines in case the logic circuit of FIG. 16 is realized in the basic cell BC; and FIG. 32 shows a connection state in broken lines in case the logic circuit of FIG. 21 is realized in the basic cell BC. In these Figures, the ground voltage supply line GND for supplying the ground voltage of the circuit is located at the upper end portion of the basic cell BC, and the supply voltage line VEE for supplying the supply voltage is located at the lower end portion of the basic cell BC. Moreover, the reference potential supply line VR for supplying the reference potential VR to be used in the logic circuit of FIG. 21 is wired between the aforementioned lines GND and VEE. Still moreover, the constant voltage supply line VIEN for supplying the constant voltage VIEN to be generated by the VGN circuit of FIG. 14 and used in the logic circuit of FIG. 21 is wired between the aforementioned lines VR and VEE. As a result, the lines GND, VEE, VR and VIEN are arranged in the vicinity of the semiconductor elements to be wired thereby so that the wires GND, VEE, VR and VIEN and the wires wiring the semiconductor elements can be shortened. Thus, the layout of the corresponding wires over the basic cell BC is simplified.

In FIGS. 30 to 32: the solid circles indicate the nodes between the wiring lines indicated by broken lines and the semiconductor elements or the wiring lines GND, VEE, VR and VIEN; the double circles indicate the input terminals SI1 and SI2 to the basic cell BC or the output terminals SO or SOP and SON from the basic cell BC; and the single circles indicate the portions left unconnected. Moreover, the symbols appearing in FIGS. 30 to 32 are those used in FIGS. 15, 16 and 21 so that they may be easily understood.

Thus, the individual logic circuits of FIGS. 15, 16 and 21 can be formed by connecting the elements in one basic cell BC in a desired manner. Incidentally, if the elements in one basic cell BC is used, although not shown, the individual logic circuits of FIG. 1, FIGS. 7 to 10, FIG. 12 and FIGS. 17 to 20 can be formed, as could be easily understood. If, moreover, two adjacent basic cells BC are used, the logic circuit of FIG. 22 can be formed.

Incidentally, if two PMOSFETs are formed in the basic cell in place of the bipolar transistors B1 and B2 of FIG. 28, the individual logic cells of FIGS. 11, 13 and 23 can be formed of one basic cell. In this case, in the schematic diagram of the basic cell of FIG. 30, for example, the constant voltage supply line VIEP to be fed with the constant voltage VIEP generated from the VGP circuit of FIG. 14 is wired between the lines GND and VR. More preferably, two P-MOSFETs may be additionally formed in the basic cell BC of FIG. 28. However, it should be noted that the number of the basic cells BC formed over one chip becomes smaller than that of the basic cells BC in the gate array using the basic cell BC of FIG. 28 because the area to be occupied by one basic cell BC is increased.

Figure 33:
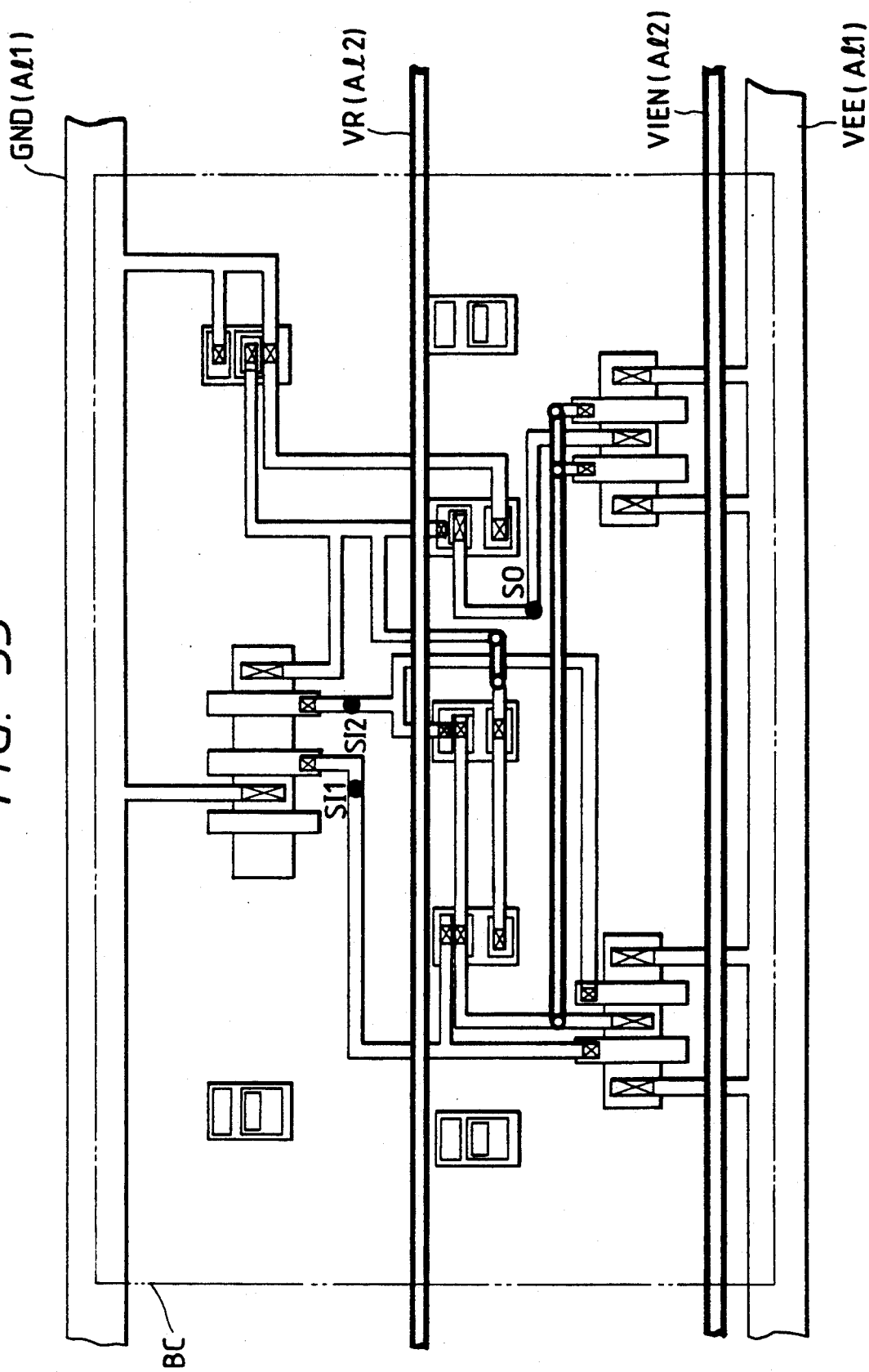
FIG. 33 is a layout diagram of the case, in which the logic circuit of FIG. 15 is realized in the basic cell of FIG. 28.

FIG. 33 is a layout diagram showing the wiring lines of FIG. 30 three-dimensionally. The region defined by double dotted lines indicates the basic cell BC. The lines GND and VEE indicated by thin solid lines and the lines indicated by thin solid lines are made of a first-layer aluminum line Al1 and are discriminated from a second-layer aluminum line Al2. Blank circles indicate through holes which are opened in an insulating film for connecting the first-layer line Al1 and the second-layer line Al2, and solid circles indicate the positions of input-/output terminals which are made receptive of input-/output signals from other basic cells. The regions indicated by squares having letters X are contact portions. The lines VCC (Al1), VR(Al2), VIEN (Al2) and VEE (Al1) are those to be commonly used for a plurality of basic cells, and the remaining lines are those in the cells and are wired with the first-layer aluminum line (Al1) and the second-layer aluminum line (Al2) for crossing the former partially.

Figure 34:
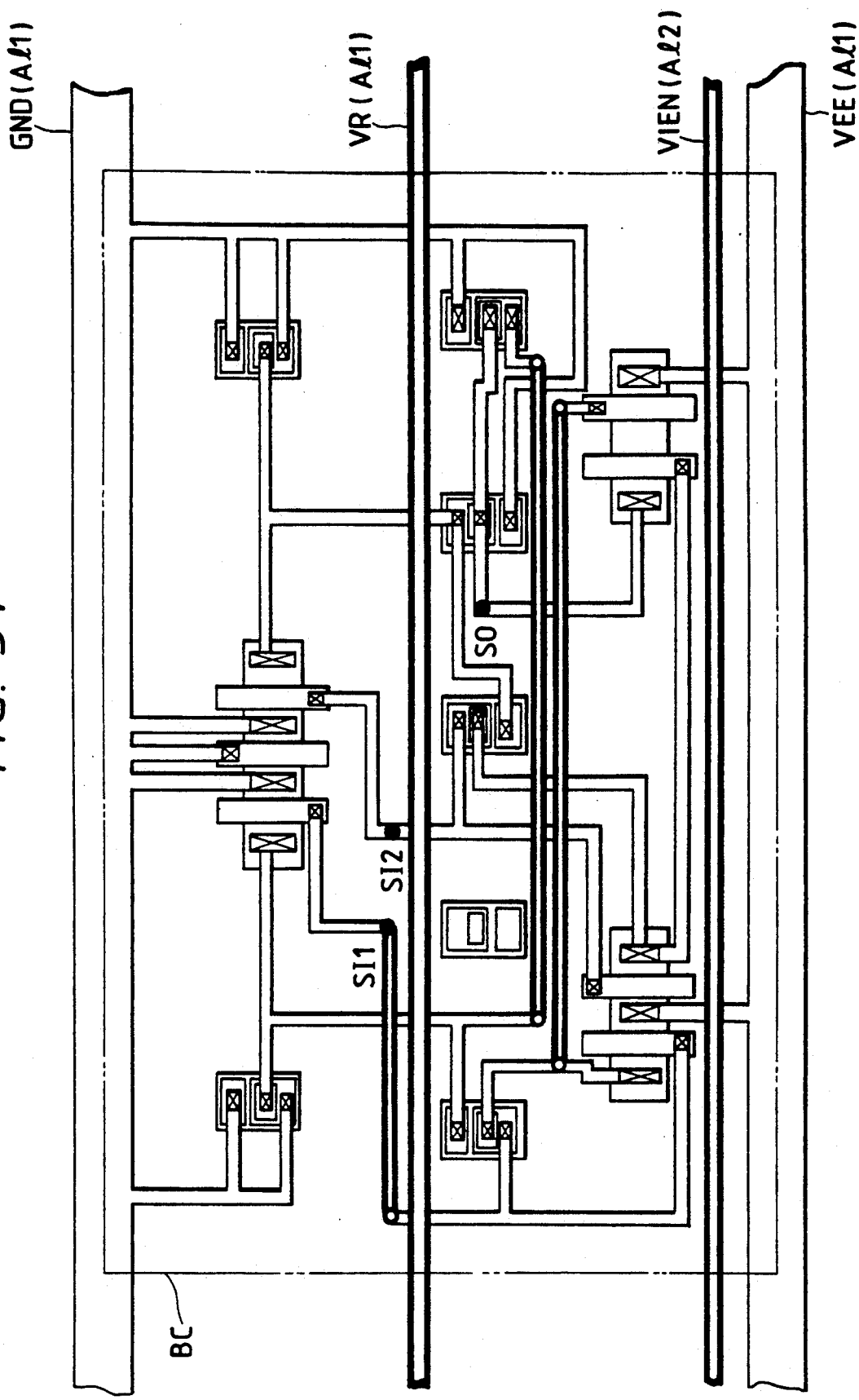
FIG. 34 is a layout diagram of the case, in which the logic circuit of FIG. 16 is realized in the basic cell of FIG. 28.

FIG. 34 is a layout diagram expressing the wiring lines of FIG. 31 three-dimensionally.

Figure 35:
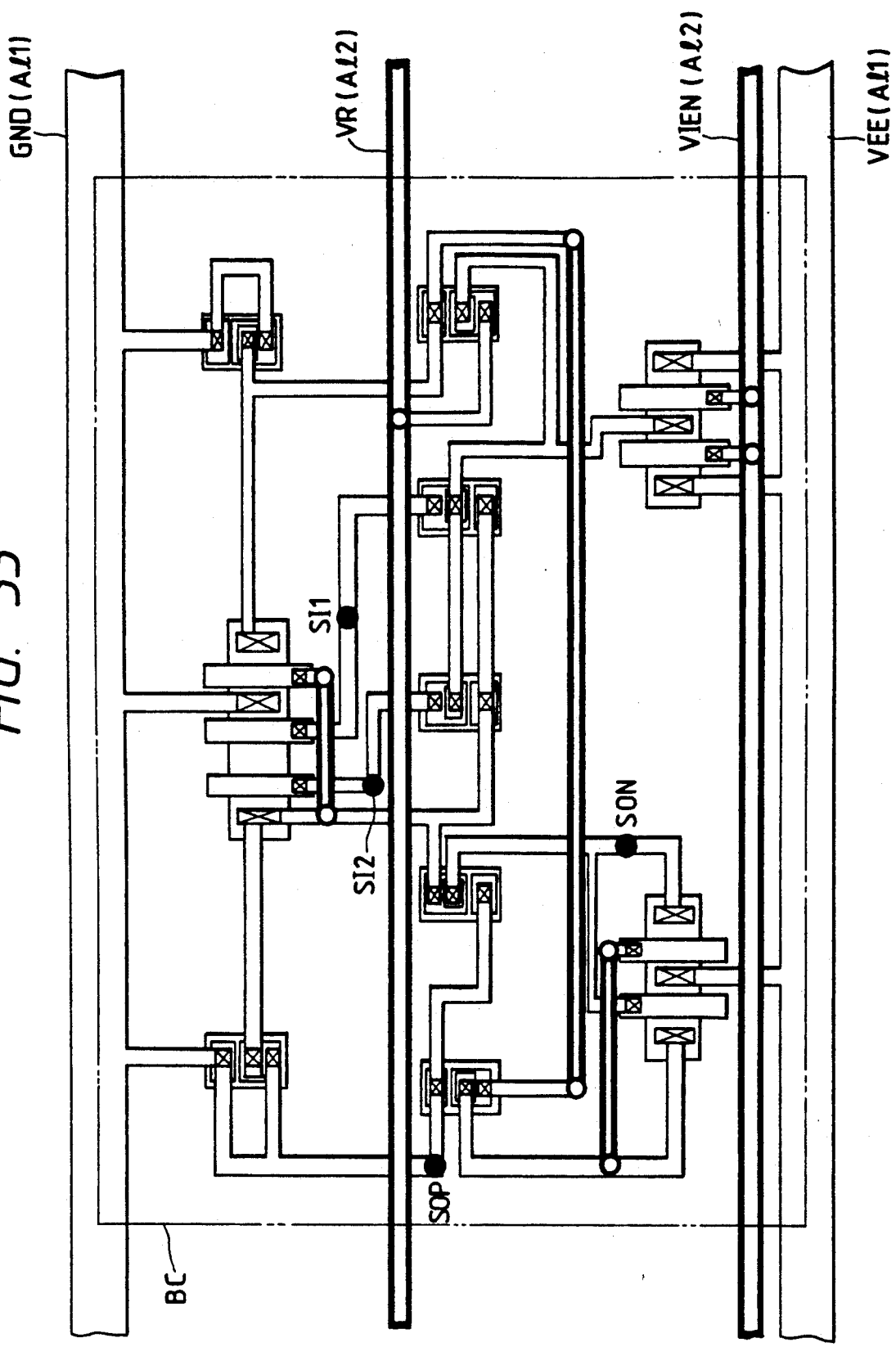
FIG. 35 is a layout diagram of the case, in which the logic circuit of FIG. 21 is realized in the basic cell of FIG. 28.

FIG. 35 is a layout diagram expressing the wiring lines of FIG. 32 three-dimensionally.

By using the wiring lines of FIGS. 28 to 35, the logic circuits of the embodiments of the present invention, as shown in FIG. 15 (i.e., 2-input/1-output NOR gate), FIG. 16 (i.e., 2-input/1-output NAND gate) and FIG. 21 (i.e., 2-input/2-output NOR/OR gate), can be realized by the identical basic cell of the gate array. What is noted here is that one basic cell in the existing ECL circuit can constitute nothing but OR and NOR. If, however, the bipolar·CMOS logic circuit according to the present invention, as shown in FIG. 16, is used, the NAND gate can be constituted by one basic cell. As a result, the number of logic stages can be reduced when a logic using the NAND circuit is to be constituted.

Thus, by using a basic cell shown in FIG. 28, a circuit requiring a high speed operation is formed by forming a high speed ECL circuit (e.g., those of FIGS. 17, 19, 20 and 21) of corresponding elements in the basic cell, and a circuit (of FIG. 15) enabled to reduce the power consumption by making variable the impedances of the current source and the output pulldown NMOS. As a result, it is possible to realize a gate array which has a higher speed, a lower power consumption and a lower heat release.

Figure 36:
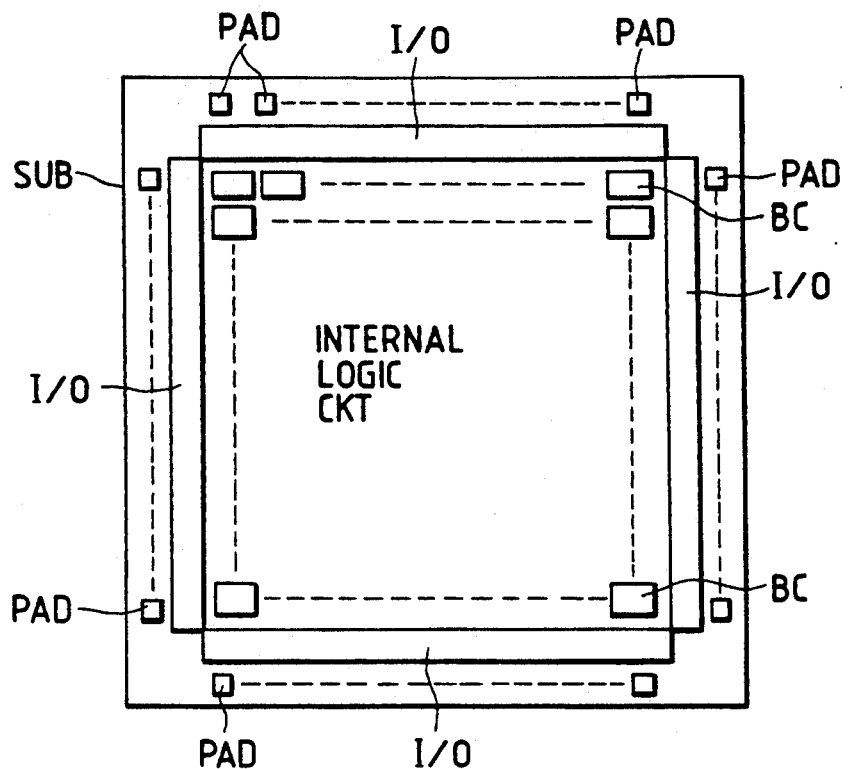
FIG. 36 is a layout diagram showing a channelless type gate array chip including the plurality of basic cells of FIG. 28.

FIG. 36 is a chip layout diagram showing a gate array in which the basic cells BC of FIG. 28 are arrayed all over the area excepting the external terminals (PAD) and the input/output buffers (I/O) without forming any wiring region.

In FIG. 36, the gate array includes: a plurality of external connection terminals PAD arranged in the peripheral portion of a square semiconductor substrate SUB and acting as signal input/output terminals; an internal logic circuit having a plurality of basic cells BC arranged regularly at the central portion of the semiconductor substrate SUB; and input/output buffer circuits I/O arranged between the internal logic circuit and the external terminals PAD, although not especially limited thereto. This Figure shows the wiring channel-less type gate array by way of example. All the basic cells included in the gate array are made to have an identical structure, although not especially limited thereto. These basic cells are formed by using those of FIG. 28.

Figure 37:
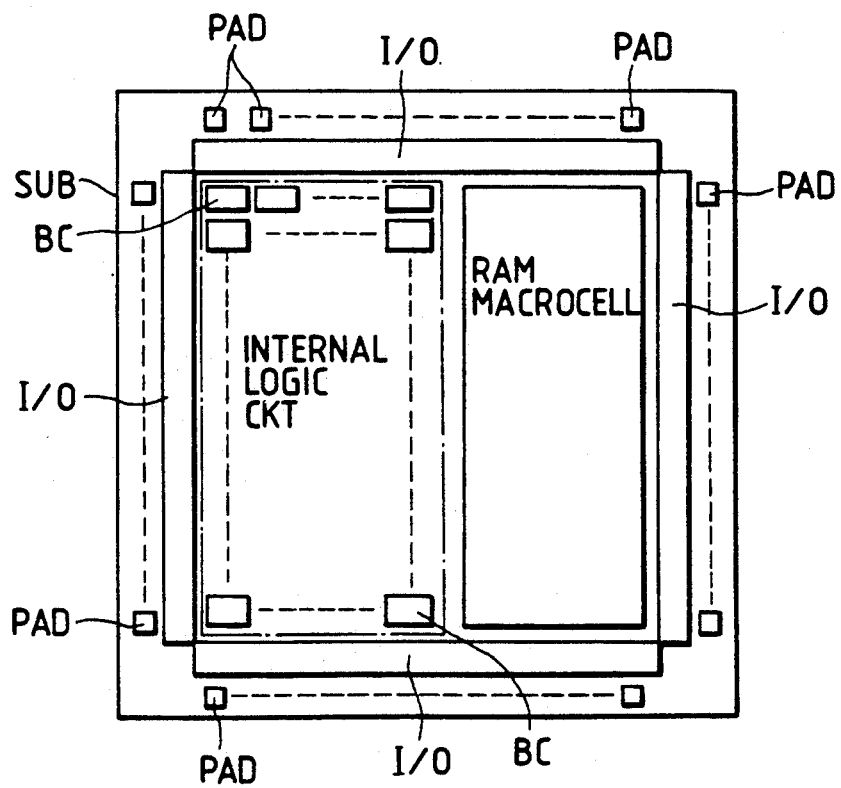
FIG. 37 is a top plan view showing a chip of a semiconductor integrated circuit device including a gate array portion including the plurality of basic cells of FIG. 28 and a RAM macro cell.

FIG. 37 is a chip layout diagram showing another gate array. In the same Figure, the region to be arranged with the basic cells BC is a portion of the region over the chip excepting the terminals PAD and the buffer circuits I/O, and the remaining portion is arranged with a RAM macro cell. The basic cells BC in FIG. 37 have an element layout shown in FIG. 28. The RAM macro cell of FIG. 37 can be constructed of the static RAM of FIGS. 26 and 27.

Incidentally, the input/output buffer circuits I/O of FIGS. 36 and 37 can be formed in the buffer cell having the individual semiconductor elements in the basic cell BC shown in FIG. 28. Nevertheless, the driving abilities of the individual elements of the buffer cell are made higher than those of the individual elements in the basic cell. The effects to be enumerated at this time are the higher speed and the lower power consumption.

What is claimed is:

1. A logic circuit comprising:
an input terminal coupled to receive an input signal having a logic high level and a logic low level;
an output terminal coupled to a load capacitance;
a first supply terminal coupled to receive a first supply voltage;
a second supply terminal coupled to receive a second supply voltage;
a third supply terminal coupled to receive a third supply voltage;
a first bipolar transistor having a base coupled to said input terminal, a collector and an emitter;
variable impedance means, connected between said first supply terminal and said collector of said first bipolar transistor, having a relatively high impedance value in response to said logic high level at said input terminal and having a relatively low impedance value in response to said logic low level at said input terminal;
a first N-channel MOSFET having a source-drain path coupled between said emitter of said first bipolar transistor and said second supply terminal, wherein said first N-channel MOSFET has a conductance which is increased in response to said logic high level at said input terminal and which is decreased in response to said logic low level at said input terminal;
a second bipolar transistor for charging said load capacitance in response to said variable impedance means having said low impedance value, wherein said second bipolar transistor has an emitter-collector path coupled between said first supply terminal and said output terminal and a base coupled to receive a collector potential of said first bipolar transistor; and
charge extracting means connected between said output terminal and said third supply terminal for discharging said load capacitance.

2. A logic circuit according to claim 1, wherein said second supply voltage and said third supply voltage are at a common potential.

3. A logic circuit according to claim 2, wherein said first N-channel MOSFET has a gate coupled to said input terminal.

4. A logic circuit according to claim 3, wherein said variable impedance means includes: a first P-channel MOSFET having a drain-source path coupled between said first supply terminal and said collector of said first bipolar transistor and a gate coupled to said input terminal; and a diode connected in parallel with said drain-source path of said first P-channel MOSFET.

5. A logic circuit according to claim 4, wherein said charge extracting means includes a second N-channel MOSFET having a drain-source path coupled between said output terminal and said third supply terminal and a gate coupled to said emitter of said first bipolar transistor, and wherein said second N-channel MOSFET has a threshold value smaller than that of said first N-channel MOSFET.

6. A logic circuit according to claim 4, wherein said charge extracting means includes a second N-channel MOSFET having a drain-source path coupled between said output terminal and said third supply terminal and a gate coupled to said input terminal, and wherein said second N-channel MOSFET has a threshold value substantially the same as that of said first N-channel MOSFET.

7. A logic circuit according to claim 4, wherein said charge extracting means includes a second P-channel MOSFET having a drain-source path coupled between said output terminal and said third supply terminal and a gate coupled to said collector of said first bipolar transistor.

8. A logic circuit according to claim 4, wherein said charge extracting means includes a second N-channel MOSFET having a drain-source path coupled between said output terminal and said third supply terminal and a gate coupled to receive a predetermined reference voltage, and wherein said second N-channel MOSFET has a threshold value smaller than that of said first N-channel MOSFET.

9. A logic circuit according to claim 5, further comprising a third N-channel MOSFET having a drain coupled to said collector of said first bipolar transistor, a source connected with said third supply terminal, and a gate connected with said emitter of said first bipolar transistor.

10. A logic circuit according to claim 3, wherein said variable impedance means includes: a first P-channel MOSFET having a drain-source path coupled between said first supply terminal and said collector of said first bipolar transistor and a gate coupled to said input terminal; and a second P-channel MOSFET having a drain-source path connected in parallel with said drain-source path of said first P-channel MOSFET, said second P-channel MOSFET has a gate coupled to receive a predetermined voltage, and wherein said charge extracting means includes a second N-channel MOSFET having a drain-source path coupled between said output terminal and said third supply terminal and a gate coupled to said emitter of said first bipolar transistor.

11. A logic circuit according to claim 2, wherein said variable impedance means includes: a first P-channel MOSFET having a drain-source path coupled between said first supply terminal and said collector of said first bipolar transistor and a gate coupled to said input terminal; and a second P-channel MOSFET having a source-drain path connected in parallel with said drain-source path of said first P-channel MOSFET, said second P-channel MOSFET has a gate coupled to receive a predetermined voltage, wherein said charge extracting means includes a second N-channel MOSFET having a drain-source path coupled between said output terminal and said third supply terminal and a gate coupled to said emitter of said first bipolar transistor, and wherein said first N-channel MOSFET has its gate coupled to receive a predetermined voltage in response to said logic high level at said input terminal.

12. A logic circuit according to claim 1, wherein said first N-channel MOSFET has a gate coupled to said input terminal, wherein said variable impedance means includes: a first P-channel MOSFET having a drain-source path coupled between said first supply terminal and said collector of said first bipolar transistor and a gate coupled to said input terminal; and a diode connected in parallel with said drain-source path of said first P-channel MOSFET, and wherein said charge extracting means includes a second N-channel MOSFET having a drain-source path coupled between said output terminal and said third supply terminal and a gate coupled to said emitter of said first bipolar transistor.

13. A logic circuit according to claim 5, further comprising:

a second input terminal;

a second P-channel MOSFET having a drain-source path connected in series with said drain-source path of said first P-channel MOSFET and a gate coupled to said second input terminal, wherein the series connection of said first and second P-channel MOSFETs is in parallel connection with said diode;

a third bipolar transistor having a collector-emitter path connected in parallel with said collector-emitter path of said first bipolar transistor and a base coupled to said second input terminal; and a third N-channel MOSFET having a drain-source path connected in parallel with said drain-source path of said first N-channel MOSFET and a gate coupled to said second input terminal.

14. A semiconductor device comprising:

a plurality of word lines;

a plurality of pairs of data lines;

a plurality of memory cells coupled to said plurality of word lines and to said plurality of pairs of data lines so that each memory cell is coupled to one of said word lines and one of said plurality of pairs of data lines; and a plurality of word driver circuits coupled to said plurality of word lines, respectively, for bringing one of said plurality of word lines into a selection state, wherein each of said plurality of word driver circuits includes:

a first supply terminal;

a second supply terminal;

input bipolar transistors each having a base coupled to receive one of a plurality of input signals, respectively, a collector and an emitter, the collectors of said input bipolar transistors being coupled to one another, the emitters of said input bipolar transistors being coupled to one another, said plurality of input signals having a logic high level or a logic low level;

P-channel MOSFETs having their gates coupled to the bases of said input bipolar transistors, respectively, and their source-drain paths coupled in series between a first supply terminal and the commonly coupled collectors of said input bipolar transistors;

N-channel MOSFETs having their gates coupled to the bases of said input bipolar transistors, respectively, and their source-drain paths coupled between the commonly coupled emitters of said input bipolar transistors and said second supply terminal, respectively;

an output terminal coupled to a corresponding one of said word lines;

an output bipolar transistor having a collector-emitter path coupled between said first supply terminal and said output terminal and a base coupled to said commonly coupled collectors of said input bipolar transistors;

an output N-channel MOSFET having a source-drain path coupled between said output terminal and said second supply terminal and a gate coupled to said commonly coupled emitters of said input bipolar transistors; and level clamp means coupled between said first supply terminal and said base of said output bipolar transistor for clamping a voltage level of said base of said output bipolar transistor at a predetermined voltage when at least one of said plurality of input signals is at said logic high level.

15. A logic circuit according to claim 1, wherein said first and second bipolar transistors are of an NPN type.

16. A logic circuit according to claim 5, wherein said first and second bipolar transistors are of an NPN type.

17. A logic circuit according to claim 6, wherein said first and second bipolar transistors are of an NPN type.

18. A logic circuit according to claim 7, wherein said first and second bipolar transistors are of an NPN type.

19. A logic circuit according to claim 8, wherein said first and second bipolar transistors are of an NPN type.

20. A logic circuit according to claim 9, wherein said first and second bipolar transistors are of an NPN type.

21. A logic circuit according to claim 10, wherein said first and second bipolar transistors are of an NPN type.

22. A logic circuit according to claim 11, wherein said first and second bipolar transistors are of an NPN type.

23. A logic circuit according to claim 12, wherein said first and second bipolar transistors are of an NPN type.

24. A logic circuit according to claim 13, wherein said first to third bipolar transistors are of an NPN type.

25. A logic circuit according to claim 1, wherein said logic circuit is formed on a semiconductor substrate.

26. A logic circuit according to claim 7, wherein said second P-channel MOSFET has a gate coupled to said collector of said first bipolar transistor via a level shifting impedance circuit.

27. A logic circuit according to claim 26, wherein said first and second bipolar transistors are of an NPN type.

28. A logic circuit comprising:
- a first input terminal coupled to receive a first input signal having a logic high level or a logic low level;
- a second input terminal coupled to receive a second input signal having a logic high level or a logic low level;
- a first supply terminal coupled to receive a first supply voltage;
- a second supply terminal coupled to receive a second supply voltage;
- a first output terminal for supplying a first output signal;
- a second output terminal for supplying a second output signal;
- a first bipolar transistor having a collector-emitter path coupled between said first supply terminal and said second supply terminal and a base coupled to said first input terminal;
- a second bipolar transistor having a collector-emitter path connected in parallel with said collector-emitter path of said first bipolar transistor and a base coupled to said second input terminal;
- a third bipolar transistor having a collector-emitter path coupled between said first supply terminal and said second supply terminal and a base coupled to receive a reference potential, wherein said third bipolar transistor has its emitter commonly coupled to the emitters of said first and second bipolar transistors;
- first variable impedance means connected between said first supply terminal and the collectors of said first and second bipolar transistors, wherein said first variable impedance means has a low impedance value when both said first input signal and said second input signal are at said logic low level and a high impedance value when at least one of said first input signal and said second input signal is at said logic high level;
- second variable impedance means connected between said first supply terminal and said collector of said third bipolar transistor, wherein said second variable impedance means has a high impedance value when both said first input signal and said second input signal are at said logic low level, and a low impedance value when at least one of said first input signal and said second input signal is at said logic high level;
- a fourth bipolar transistor having a collector-emitter path coupled between said first supply terminal and said first output terminal and a base coupled to said collector of said third bipolar transistor;
- a fifth bipolar transistor having a collector-emitter path coupled between said first supply terminal and said second output terminal and a base coupled to the collectors of said first and second bipolar transistors;
- first charge extracting means connected between said first output terminal and said second supply terminal, wherein said first charge extracting means discharges a first load capacitance coupled to said first output terminal;
- second charge extracting means connected between said second output terminal and said second supply terminal, wherein said second charge extracting means discharges a second load capacitance coupled to said second output terminal; and
- a first N-channel MOSFET having a drain source path coupled between commonly coupled emitters of said first, second and third bipolar transistors and said second supply terminal, and a gate coupled to receive a first predetermined voltage.

29. A logic circuit according to claim 28, wherein said first variable impedance means includes: a first p-channel MOSFET having a source-drain coupled between said first supply terminal and the collectors of said first and second bipolar transistors, and a gate connected with said collector of said third bipolar transistor; and a first diode having an anode-cathode path connected in parallel with said source-drain path of said first p-channel MOSFET, and wherein said second variable impedance means includes: a second P-channel MOSFET having a source-drain path coupled between said first supply terminal and said collector of said third bipolar transistor, and a gate connected with the collectors of said first and second bipolar transistors; and a second diode having an anode-cathode path connected in parallel with said source-drain path of said second P-channel MOSFET.

30. A logic circuit according to claim 29, wherein said first charge extracting means includes a second N-channel MOSFET having a drain-source path connected between said first output terminal and said second output terminal, and a gate connected with said second output terminal, and wherein said second charge extracting means includes a third N-channel MOSFET having a drain-source path connected between said second output terminal and said supply terminal, and a gate connected with said first output terminal.

31. A logic circuit according to claim 29, wherein said first charge extracting means includes a second N-channel MOSFET having a drain-source path connected between said first output terminal and said second supply terminal, and a gate connected with the commonly coupled collectors of said first and second bipolar transistors, and wherein said second charge extracting means includes a third N-channel MOSFET having a drain-source path connected between said second output terminal and said second supply terminal, and a gate connected with said collector of said third bipolar transistor.

32. A logic circuit according to claim 28, wherein said first variable impedance means includes: a first P-channel MOSFET and a second P-channel MOSFET having drain-source paths connected in series between said first supply terminal and said collector of said first bipolar transistor; and a first diode having an anode-cathode coupled between said first supply terminal and the commonly coupled collectors of said first and second bipolar transistors, wherein said first P-channel MOSFET receives said first input signal at its gate, and said second P-channel MOSFET receives said second input signal at its gate, and wherein said second variable impedance means includes: a third P-channel MOSFET having a source-drain path connected between said first supply terminal and said collector of said third bipolar transistor, and a gate connected with the commonly coupled collectors of said first and second bipolar transistors; and a diode having an anode-cathode path connected in parallel with said source-drain path of said third P-channel MOSFET.

33. A logic circuit according to claim 32, wherein said first charge extracting means includes a second N-channel MOSFET having a drain-source path connected between said first output terminal and said second supply terminal, and a gate connected with the commonly coupled collectors of said first and second bipolar transistors, and wherein said second charge extracting means includes a third N-channel MOSFET having a drain-source path connected between said second output terminal and said second supply terminal, and a gate connected with said collector of said third bipolar transistor.

34. A logic circuit according to claim 32, wherein said first charge extracting means includes a second N-channel MOSFET having a drain-source path connected between said first output terminal and said second supply terminal, and a gate connected with said second output terminal, and wherein said second charge extracting means includes a third N-channel MOSFET having a drain-source path connected between said second output terminal and said second supply terminal, and a gate connected with said first output terminal.

35. A logic circuit according to claim 28, wherein said first variable impedance means includes: a first P-channel MOSFET having a source-drain path coupled between said first supply terminal and the commonly coupled collectors of said first and second bipolar transistors, and a gate coupled to said collector of said third bipolar transistor; and a second P-channel MOSFET having a source-drain path connected in parallel with said source-drain path of said first P-channel MOSFET, said second P-channel MOSFET receives a second predetermined voltage at its gate, wherein said second variable impedance means includes: a third P-channel MOSFET having a source-drain path coupled between said first supply terminal and said collector of said third bipolar transistor, and a gate coupled to the commonly coupled collectors of said first and second bipolar transistors; and a fourth P-channel MOSFET having a source-drain path connected in parallel with said source-drain path of said third P-channel MOSFET, said fourth P-channel MOSFET receives a third predetermined voltage at its gate, wherein said first charge extracting means includes: a second N-channel MOSFET having a drain-source path coupled between said first output terminal and said second supply terminal, and a gate connected with the commonly coupled collectors of said first and second bipolar transistors; and a first voltage source connected between the source of said second N-channel MOSFET and said second supply terminal, and wherein said second charge extracting means includes: a third N-channel MOSFET having a drain-source path coupled between said second output terminal and said second supply terminal, and a gate connected with said collector of said third bipolar transistor; and a second voltage source connected between said source of said third N-channel MOSFET and said second supply terminal.

36. A logic circuit according to claim 28, wherein said first to fifth bipolar transistors are of an NPN type.

37. A logic circuit according to claim 30, wherein said first to fifth bipolar transistors are of an NPN type.

38. A logic circuit according to claim 31, wherein said first to fifth bipolar transistors are of an NPN type.

39. A logic circuit according to claim 33, wherein said first to fifth bipolar transistors are of an NPN type.

40. A logic circuit according to claim 34, wherein said first to fifth bipolar transistors are of an NPN type.

41. A logic circuit according to claim 35, wherein said first to fifth bipolar transistors are of an NPN type.

42. A logic circuit according to claim 28, wherein said logic circuit is formed on a semiconductor substrate.

43. A logic circuit comprising:

a first input terminal coupled to receive a first input signal having a logic high level and a logic low level;

a second input terminal coupled to receive a second input signal which is a phase inverted signal of said first input signal;

a first supply terminal coupled to receive a first supply voltage;

a second supply terminal coupled to receive a second supply voltage;

a first bipolar transistor having a base coupled to said first input terminal, a collector and an emitter;

a second bipolar transistor having a base, a collector and an emitter;

first variable impedance means coupled between said first supply terminal and said collector of said first bipolar transistor and having a relatively low impedance value when said first input signal is at said logic low level and a relatively high impedance value when said first input signal is at said logic high level, wherein said first variable impedance means includes a first P-channel MOSFET having a gate coupled to said first input terminal and a source-drain path coupled between said first supply terminal and said collector of said first bipolar transistor, and first level clamp means connected in parallel with said source-drain path of said first P-channel MOSFET for clamping a voltage level of said collector of said first bipolar transistor in response to a logic low level at said first input signal;

second variable impedance means coupled between said first supply terminal and said collector of said second bipolar transistor and having a relatively high impedance value when said first input signal is at said logic low level and a relatively low impedance value when said first input signal is at said logic high level, wherein said second variable impedance means includes a second P-channel MOSFET having a gate coupled to said second input terminal and a source-drain path coupled between said first supply terminal and said collector of said second bipolar transistor, and second level clamp means connected in parallel with said source-drain path of said second P-channel MOSFET for clamping a voltage level of said collector of said second bipolar transistor in response to a logic high level at said first input signal; and a MOSFET having a gate coupled to receive a first predetermined voltage and having a drain-source path coupled between a common emitter connection of said first and second bipolar transistors and said second supply terminal.

44. A logic circuit according to claim 43, wherein said first level clamp means includes a third P-channel MOSFET having a source coupled to said first supply terminal, a drain coupled to said collector of said first P-channel MOSFET and a gate coupled to receive a second predetermined voltage, and wherein said second level clamp means includes a fourth P-channel MOSFET having a source coupled to said first supply terminal, a drain coupled to said collector of said second P-channel MOSFET and a gate coupled to receive said second predetermined voltage.

45. A logic circuit according to claim 44, further comprising:

a third bipolar transistor having a base coupled to said collector of said first bipolar transistor, a collector coupled to said first supply terminal and an emitter;

a fourth bipolar transistor having a base coupled to said collector of said second bipolar transistor and an emitter;

a first charge extracting means coupled between said emitter of said third bipolar transistor and said second supply terminal; and a second charge extracting means coupled between said emitter of said fourth bipolar transistor and said second supply terminal.

46. A logic circuit according to claim 45, wherein said first charge extracting means is a first N-channel MOSFET having a gate coupled to said collector of said second bipolar transistor, a drain coupled to said emitter of said third bipolar transistor and a source coupled to said second supply terminal, and wherein said second charge extracting means is a second N-channel MOSFET having a gate coupled to said collector of said first bipolar transistor, a drain coupled to said emitter of said fourth bipolar transistor and a source coupled to said second supply terminal.

47. A logic circuit according to claim 46, wherein said MOSFET is a third N-channel MOSFET.

48. A logic circuit according to claim 47, wherein said base of said second bipolar transistor is coupled to receive a reference potential.

49. A logic circuit according to claim 43, wherein said base of said second bipolar transistor is coupled to said second input terminal.

50. A logic circuit according to claim 47, wherein said base of said second bipolar transistor is coupled to said second input terminal.

51. A logic circuit comprising:

a first input terminal coupled to receive a first input signal having a logic high level and a logic low level;

a first supply terminal coupled to receive a first supply voltage;

a second supply terminal coupled to receive a second supply voltage;

a first bipolar transistor having a base coupled to said first input terminal, a collector and an emitter;

a second bipolar transistor having a base, a collector and an emitter;

first variable impedance means coupled between said first supply terminal and said collector of said first bipolar transistor and having a relatively low impedance value when said first input signal is at said logic low level and a relatively high impedance value when said first input signal is at said logic high level;

second variable impedance means coupled between said first supply terminal and said collector of said second bipolar transistor and having a relatively high impedance value when said first input signal is at said logic low level and a relatively low impedance value when said first input signal is at said logic high level; and a MOSFET having a gate coupled to receive a first predetermined voltage and having a drain-source path coupled between a common emitter connection of said first and second bipolar transistors and said second supply terminal, wherein said first variable impedance means includes a first P-channel MOSFET having a gate coupled to said collector of said second bipolar transistor and a source-drain path coupled between said first supply terminal and said collector of said first bipolar transistor, and first level clamp means for clamping a voltage level of said collector of said first bipolar transistor in response to a logic low level at said input signal, said first level clamp means including a second P-channel MOSFET having a source coupled to said first supply terminal, a drain coupled to said collector of said first bipolar transistor and a gate coupled to receive a second predetermined voltage, and wherein said second variable impedance means includes a third P-channel MOSFET having a gate coupled to said collector of said first bipolar transistor and a source-drain path coupled between said first supply terminal and said collector of said second bipolar transistor, and second level clamp means for clamping a voltage level of said collector of said second bipolar transistor in response to a logic high level at said input signal, said second level clamp means including a fourth P-channel MOSFET having a source coupled to said first supply terminal, a drain coupled to said collector of said second bipolar transistor and a gate coupled to receive said second predetermined voltage.

52. A logic circuit according to claim 51, further comprising:

a third bipolar transistor having a base coupled to said collector of said first bipolar transistor, a collector coupled to said first supply terminal and an emitter;

a fourth bipolar transistor having a base coupled to said collector of said second bipolar transistor and an emitter;

a first charge extracting means coupled between said emitter of said third bipolar transistor and said second supply terminal; and a second charge extracting means coupled between said emitter of said fourth bipolar transistor and said second supply terminal.

53. A logic circuit according to claim 45, wherein said first charge extracting means is a first N-channel MOSFET having a gate coupled to said collector of said second bipolar transistor, a drain coupled to said emitter of said third bipolar transistor and a source coupled to said second supply terminal, and wherein said second charge extracting means is a second N-channel MOSFET having a gate coupled to said collector of said first bipolar transistor, a drain coupled to said emitter of said fourth bipolar transistor and a source coupled to said second supply terminal.

54. A logic circuit according to claim 53, wherein said MOSFET is a third N-channel MOSFET.

55. A logic circuit according to claim 54, wherein said base of said second bipolar transistor is coupled to receive a reference potential.

* * * * *